United States Patent
Hata et al.

(10) Patent No.: US 6,649,942 B2
(45) Date of Patent: Nov. 18, 2003

(54) NITRIDE-BASED SEMICONDUCTOR LIGHT-EMITTING DEVICE

(75) Inventors: Masayuki Hata, Kadoma (JP); Yasuhiko Nomura, Moriguchi (JP); Kunio Takeuchi, Joyo (JP); Tsutomu Yamaguchi, Nara (JP); Takashi Kano, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/150,930

(22) Filed: May 21, 2002

(65) Prior Publication Data

US 2002/0190263 A1 Dec. 19, 2002

(30) Foreign Application Priority Data

May 23, 2001 (JP) ........................................ 2001-153418

(51) Int. Cl.[7] ................................................ H01L 33/00
(52) U.S. Cl. ......................... 257/103; 257/22; 257/97; 257/13
(58) Field of Search .............................. 257/13, 96, 97, 257/19, 22, 76, 103

(56) References Cited

U.S. PATENT DOCUMENTS

| | | | | |
|---|---|---|---|---|
| 4,922,499 A | * | 5/1990 | Nitta et al. | 372/46 |
| 5,157,682 A | * | 10/1992 | Shimada | 372/50 |
| 5,381,756 A | * | 1/1995 | Kondo et al. | 117/104 |
| 5,563,422 A | | 10/1996 | Nakamura et al. | |
| 5,585,648 A | * | 12/1996 | Tischler | 257/77 |
| 5,874,747 A | * | 2/1999 | Redwing et al. | 257/77 |
| 6,100,586 A | * | 8/2000 | Chen et al. | 257/745 |
| 6,121,634 A | * | 9/2000 | Saito et al. | 257/86 |
| 6,232,137 B1 | * | 5/2001 | Sugawara et al. | 438/46 |
| 6,258,617 B1 | | 7/2001 | Nitta et al. | |
| 6,350,997 B1 | * | 2/2002 | Saeki | 257/102 |
| 6,399,963 B2 | * | 6/2002 | Sugawara et al. | 257/96 |
| 6,452,214 B2 | * | 9/2002 | Kaneyama et al. | 257/79 |
| 6,459,100 B1 | * | 10/2002 | Doverspike et al. | 257/97 |
| 6,479,836 B1 | * | 11/2002 | Suzuki et al. | 257/15 |
| 6,495,862 B1 | * | 12/2002 | Okazaki et al. | 257/103 |
| 2001/0019136 A1 | * | 9/2001 | Sugawara et al. | 257/103 |

FOREIGN PATENT DOCUMENTS

| | | |
|---|---|---|
| EP | 0 805 500 | 11/1997 |
| JP | 6-314822 | 8/1994 |
| JP | 9-289351 | 11/1997 |

* cited by examiner

*Primary Examiner*—David Nelms
*Assistant Examiner*—Andy Huynh
(74) *Attorney, Agent, or Firm*—McDermott, Will & Emery

(57) ABSTRACT

A nitride-based semiconductor light-emitting device capable of attaining homogeneous emission with a low driving voltage is obtained. This nitride-based semiconductor light-emitting device comprises a first conductivity type first nitride-based semiconductor layer formed on a substrate, an emission layer, consisting of a nitride-based semiconductor, formed on the first nitride-based semiconductor layer, a second conductivity type second nitride-based semiconductor layer formed on the emission layer, a second conductivity type intermediate layer, consisting of a nitride-based semiconductor, formed on the second nitride-based semiconductor layer, a second conductivity type contact layer, including a nitride-based semiconductor layer having a smaller band gap than gallium nitride, formed on the intermediate layer, and a light-transmitting electrode formed on the contact layer. Thus, a carrier concentration and electric conductivity higher than those of a contact layer (nitride-based semiconductor layer) consisting of gallium nitride is obtained.

26 Claims, 9 Drawing Sheets

NITRIDE-BASED SEMICONDUCTOR LIGHT-EMITTING DEVICE

BACKGROUND OF THE INVENTION

1. Field of the Invention

The present invention relates to a nitride-based semiconductor light-emitting device, and more specifically, it relates to a nitride-based semiconductor light-emitting device including a nitride-based semiconductor layer represented by a group III nitride-based semiconductor.

2. Description of the Background Art

An ultraviolet LED, a blue LED or a green LED employing a nitride-based semiconductor consisting of $In_XAl_YGa_{1-Y}N$ ($0 \leq X$, $0 \leq Y$, $X+Y \leq 1$) is recently put into practice. Such an LED basically has a double hetero structure obtained by successively stacking an n-type nitride-based semiconductor layer consisting of n-type $Al_YGa_{1-Y}N$ ($0 \leq Y \leq 1$), an emission layer consisting of $In_XGa_{1-X}N$ ($0 \leq X \leq 1$) and a p-type nitride-based semiconductor layer consisting of p-type $Al_YGa_{1-Y}N$ ($0 \leq Z \leq 1$), for example, on a transparent insulating substrate.

In relation to the nitride-based semiconductor light-emitting device having the aforementioned double hetero structure, a structure obtained by providing a light-transmitting p-side electrode consisting of a metal on a p-type nitride-based semiconductor layer defining an emission observation surface for externally extracting emission from the emission layer is known in general. This structure is disclosed in Japanese Patent Laying-Open No. 6-314822 (1994), for example.

A p-side electrode and an n-side electrode employed for an LED having the aforementioned structure must be in excellent ohmic contact with a p-type nitride-based semiconductor layer and an n-type nitride-based semiconductor layer in contact with the p-side electrode and the n-side electrode respectively, in order to reduce a forward voltage. In general, therefore, the n-side electrode contains Ti and Al exhibiting excellent ohmic contact with the n-type nitride-based semiconductor layer. Further, the p-side electrode having light transmittance contains Ni and Au exhibiting excellent ohmic contact with the p-type nitride-based semiconductor layer.

When forming the p-side electrode having light transmittance on the aforementioned conventional p-type nitride-based semiconductor layer, the thickness of the p-side electrode must be increased for reducing electric resistance, in order to reduce the forward voltage of the LED. When the thickness of the p-side electrode is increased as described above, however, the transmittance of the p-side electrode is disadvantageously reduced with respect to blue light and green light. Thus, luminous intensity of light extracted from the p-side electrode is disadvantageously reduced.

When the thickness of the p-side electrode is reduced in order to improve the transmittance of the p-side electrode, on the other hand, the sheet resistance of the p-side electrode is increased to increase the contact resistance between the p-side electrode and the p-type nitride-based semiconductor layer. Therefore, a current hardly homogeneously flows from the p-side electrode to the p-type nitride-based semiconductor layer, and hence it is difficult to attain homogeneous emission. The luminous intensity is disadvantageously reduced also in this case. In order to prevent such reduction of the luminous intensity, the driving voltage for the LED must disadvantageously be increased.

SUMMARY OF THE INVENTION

An object of the present invention is to provide a nitride-based semiconductor light-emitting device capable of attaining homogeneous emission with a low driving voltage.

Another object of the present invention is to reduce the contact resistance between an electrode and a nitride-based semiconductor layer (contact layer) in the aforementioned nitride-based semiconductor light-emitting device.

Still another object of the present invention is to further reduce the sheet resistance of a light-transmitting electrode in the aforementioned nitride-based semiconductor light-emitting device.

A further object of the present invention is to reduce height of discontinuity of band gaps of the contact layer and a cladding layer in the aforementioned nitride-based semiconductor light-emitting device.

A nitride-based semiconductor light-emitting device according to an aspect of the present invention comprises a first conductivity type first nitride-based semiconductor layer formed on a substrate, an emission layer, consisting of a nitride-based semiconductor, formed on the first nitride-based semiconductor layer, a second conductivity type second nitride-based semiconductor layer formed on the emission layer, a second conductivity type intermediate layer, consisting of a nitride-based semiconductor, formed on the second nitride-based semiconductor layer, a second conductivity type contact layer, including a nitride-based semiconductor layer having a smaller band gap than gallium nitride, formed on the intermediate layer, and a light-transmitting electrode formed on the contact layer.

The nitride-based semiconductor light-emitting device according to the first aspect is provided with the second conductivity type contact layer including the nitride-based semiconductor layer having a smaller band gap than gallium nitride as hereinabove described, whereby the contact layer including the nitride-based semiconductor layer having a smaller band gap than gallium nitride can attain a higher carrier concentration than a contact layer (nitride-based semiconductor layer) consisting of gallium nitride and hence the thickness of a barrier formed on the interface between the contact layer and the electrode can be reduced. Thus, the contact resistance between the contact layer and the light-transmitting electrode can be reduced. Consequently, homogeneous emission can be attained while a driving voltage can be reduced. The nitride-based semiconductor layer having a smaller band gap than gallium nitride has higher electric conductivity than gallium nitride, and hence a current readily homogeneously spreads in the nitride-based semiconductor layer having a smaller band gap than gallium nitride. Thus, homogeneous emission can be attained also when the light-transmitting electrode is formed in a small thickness. When the second conductivity type intermediate layer is so formed as to substantially have an intermediate band gap between those of the second conductivity type contact layer and the second conductivity type second nitride-based semiconductor layer (cladding layer), the intermediate layer can reduce height of discontinuity of the band gaps of the contact layer and the cladding layer. Thus, resistance against a current flowing from the contact layer to the cladding layer can be reduced, thereby obtaining a nitride-based semiconductor light-emitting device having high luminous efficiency.

In the nitride-based semiconductor light-emitting device according to the aforementioned aspect, the carrier concentration of the second conductivity type contact layer is preferably at least $5 \times 10^{18}$ cm$^{-3}$. According to this structure, the thickness of the barrier formed on the interface between the contact layer and the electrode can be so reduced that the contact resistance between the contact layer and the light-transmitting electrode can be readily reduced. Consequently, homogeneous emission can be attained and the driving voltage can be reduced.

In the aforementioned case, the second conductivity type contact layer preferably contains gallium indium nitride. According to this structure, the band gap of the contact layer can be readily reduced below that of gallium nitride.

In the aforementioned case, the light-transmitting electrode preferably contains at least one material selected from a group consisting of nickel, palladium, platinum and gold. According to this structure, excellent ohmic contact can be attained between the light-transmitting electrode and the contact layer.

In the aforementioned case, the light-transmitting electrode is preferably formed in a thickness capable of transmitting light. According to this structure, the electrode can be readily provided with light transmittance.

In the aforementioned case, the light-transmitting electrode preferably has a thickness of not more than 10 nm. According to this structure, the electrode can be provided with excellent light transmittance.

In the aforementioned case, the light-transmitting electrode is preferably formed to have a window capable of transmitting light. According to this structure, the thickness of a portion other than the window can be so increased as to further reduce the sheet resistance of the light-transmitting electrode. In this case, a region of the light-transmitting electrode defining the window may be formed in a thickness capable of transmitting light, and the remaining region of the light-transmitting electrode other than the window may be formed in a thickness larger than the thickness capable of transmitting light. Further, the light-transmitting electrode may not be formed in a region defining the window capable of transmitting light, and the remaining region of the light-transmitting electrode other than the window may be formed in a thickness larger than the thickness capable of transmitting light. According to this structure, the sheet resistance of the light-transmitting electrode can be further reduced.

In this case, the electrode having the window capable of transmitting light may include a mesh electrode. Alternatively, the electrode having the window capable of transmitting light may include a comb-shaped electrode. Further alternatively, the electrode having the window capable of transmitting light may include a meander electrode. According to this structure, the light transmittance can be improved due to the window, while the sheet resistance of the light-transmitting electrode can be further reduced by increasing the thickness of the portion other than the window.

In the aforementioned case, the first conductivity type first nitride-based semiconductor layer preferably contains gallium nitride. Further, the emission layer preferably contains gallium indium nitride.

In the aforementioned case, the first nitride-based semiconductor layer is preferably formed on the substrate through a buffer layer. According to this structure, the density of dislocations in the first nitride-based semiconductor layer can be reduced also when the substrate is different in lattice constant from the nitride-based semiconductor. In this case, the nitride-based semiconductor light-emitting device preferably further comprises a low-dislocation-density second nitride-based semiconductor layer formed on the buffer layer by lateral growth, and the first nitride-based semiconductor layer is preferably formed on the second nitride-based semiconductor layer. According to this structure, the density of dislocations in the first nitride-based semiconductor layer can be further reduced, whereby the luminous efficiency can be further improved.

In the aforementioned case, the substrate preferably includes a substrate selected from a group consisting of a sapphire substrate, a spinel substrate, an Si substrate, an SiC substrate, a GaAs substrate, a GaP substrate, an InP substrate, a quartz substrate, a $ZrB_2$ substrate and a GaN substrate.

In the aforementioned case, the second conductivity type intermediate layer preferably substantially has an intermediate band gap between the band gap of the second conductivity type contact layer and the band gap of the second conductivity type second nitride-based semiconductor layer. According to this structure, the intermediate layer can relax discontinuity of the band gaps of the contact layer and the second nitride-based semiconductor layer, whereby resistance against the current flowing from the contact layer to the second nitride-based semiconductor layer can be reduced. Consequently, the luminous efficiency can be improved.

In this case, the second conductivity type second nitride-based semiconductor layer preferably contains a nitride-based semiconductor having a larger band gap than gallium nitride. According to this structure, height of discontinuity of the band gaps of the contact layer and the second nitride-based semiconductor layer can be readily redused when the intermediate layer is made of gallium nitride, for example.

In this case, the second conductivity type second nitride-based semiconductor layer preferably contains gallium aluminum nitride. According to this structure, the surface of the second nitride-based semiconductor layer can be prevented from degradation in growth by forming the intermediate layer consisting of a material having a smaller aluminum composition as compared with the aforementioned second nitride-based semiconductor layer containing gallium aluminum nitride or containing no aluminum. Thus, the upper surface of the second nitride-based semiconductor layer is prevented from formation of a degraded layer of high resistance, whereby the resistance against the current flowing from the contact layer to the second nitride-based semiconductor layer can be further reduced. Further, inequality of in-plane resistance resulting from degradation of the second nitride-based semiconductor layer can be reduced, thereby reducing irregular emission. Thus, homogeneous emission can be attained.

In this case, the second conductivity type intermediate layer preferably contains either gallium nitride or gallium indium nitride. According to this structure, gallium nitride or gallium indium nitride containing no aluminum can readily prevent the surface of the second nitride-based semiconductor layer from degradation.

In this case, the second conductivity type intermediate layer may have a composition continuously changing from the second conductivity type second nitride-based semiconductor layer toward the second conductivity type contact layer. According to this structure, height of discontinuity of the band gaps of the contact layer and the second nitride-based semiconductor layer can be further reduced.

The nitride-based semiconductor light-emitting device according to the aforementioned aspect may include a light-emitting diode device.

In the nitride-based semiconductor light-emitting device according to the aforementioned aspect, the second conductivity type contact layer may be doped with a p-type impurity by at least $5 \times 10^{18}$ cm$^{-3}$. According to this structure, the thickness of the barrier formed on the interface between the contact layer and the electrode can be so reduced that the contact resistance between the contact layer and the light-transmitting electrode can be readily reduced. Consequently, homogeneous emission can be attained and the driving voltage can be reduced.

In the nitride-based semiconductor light-emitting device according to the aforementioned aspect, the second conductivity type contact layer may be subjected to modulation doping to exhibit the second conductivity type. According to this structure, the thickness of the barrier formed on the interface between the contact layer and the electrode can be so reduced that the contact resistance between the contact layer and the light-transmitting electrode can be readily reduced. Consequently, homogeneous emission can be attained and the driving voltage can be reduced.

In the nitride-based semiconductor light-emitting device according to the aforementioned aspect, the second conductivity type may be the p-type.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
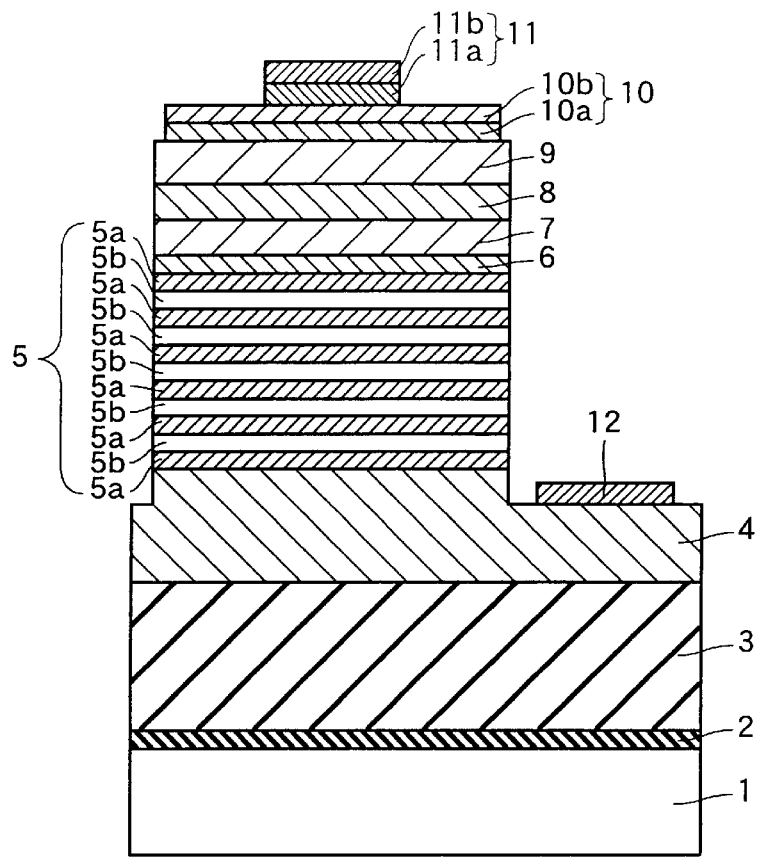
FIG. 1 is a sectional view showing a light-emitting diode device (blue LED chip) according to a first embodiment of the present invention.

The structure of a light-emitting diode device according to a first embodiment of the present invention is described with reference to FIGS. 1 and 2. As shown in FIG. 1, a low-temperature buffer layer 2 of AlGaN having a thickness of about 10 nm and a high-temperature buffer layer 3 of undoped GaN having a thickness of about 1 µm are successively formed on the (0001) plane of a sapphire substrate 1. An n-type contact layer 4 of Si-doped GaN having a projecting portion of about 5 µm in thickness is formed on the high-temperature buffer layer 3. This n-type contact layer 4 is formed to serve also as an n-type cladding layer. The sapphire substrate 1 is an example of the "substrate" according to the present invention, and the n-type contact layer 4 is an example of the "first nitride-based semiconductor layer" according to the present invention.

A multiple quantum well (MQW) emission layer 5 is formed to be in contact substantially with the overall upper surface of the projecting portion of the n-type contact layer 4. The MQW emission layer 5 is formed by alternately stacking six barrier layers 5a of undoped GaN having a thickness of about 5 nm and five well layers 5b of undoped $Ga_{0.65}In_{0.35}N$ having a thickness of about 5 nm. The MQW emission layer 5 is an example of the "emission layer" according to the present invention.

A protective layer 6 of undoped GaN having a thickness of about 10 nm is formed on the MQW emission layer 5, for preventing the MQW emission layer 5 from deterioration. A p-type cladding layer 7 of Mg-doped $Al_{0.05}Ga_{0.95}N$ having a thickness of about 0.15 µm with a dose of about $5 \times 10^{19}$ cm$^{-3}$ and a carrier concentration of about $2 \times 10^{18}$ cm$^{-3}$ and a p-type intermediate layer 8 of Mg-doped GaN having a thickness of about 0.3 µm with a dose of about $5 \times 10^{19}$ cm$^{-3}$ and a carrier concentration of about $5 \times 10^{18}$ cm$^3$ are formed on the protective layer 6 in this order. The p-type cladding layer 7 is an example of the "second nitride-based semiconductor layer" and the "cladding layer" according to the present invention, and the p-type intermediate layer 8 is an example of the "intermediate layer" according to the present invention.

A p-type contact layer 9 of Mg-doped $Ga_{0.85}In_{0.15}N$ having a thickness of about 0.3 µm with a dose of about $5 \times 10^{19}$ cm$^{-3}$ and a carrier concentration of about $8 \times 10^{18}$ cm$^{-3}$ is formed on the p-type intermediate layer 8. The p-type contact layer 9 is an example of the "contact layer" according to the present invention.

The p-type intermediate layer 8 of GaN has an intermediate band gap between the band gaps of the p-type cladding layer 7 of $Al_{0.05}Ga_{0.95}N$ and the p-type contact layer 9 of $Ga_{0.85}In_{0.15}N$.

A p-side electrode 10 formed by a Pd film 10a having a thickness of about 2 nm and an Au film 10b having a thickness of about 4 nm is provided on the upper surface of the p-type contact layer 9. The p-side electrode 10 is formed in a small thickness (about 6 nm in total), in order to transmit light. The p-side electrode 10 is an example of the "light-transmitting electrode" according to the present invention.

Figure 2:
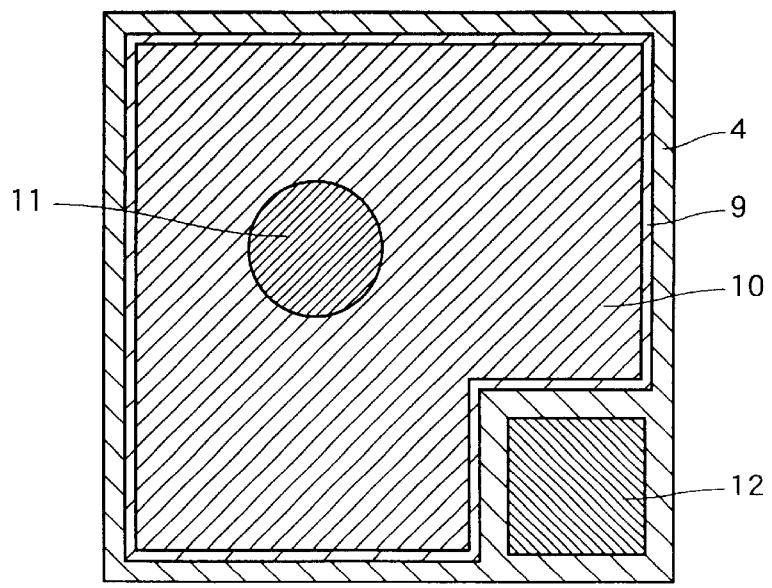
FIG. 2 is a top plan view of the light-emitting diode device (blue LED chip) shown in FIG. 1.

As shown in FIGS. 1 and 2, a p-side pad electrode 11 formed by a Ti film 11a having a thickness of about 30 nm and an Au film 11b having a thickness of about 500 nm is provided on part of the upper surface of the p-side electrode 10. Regions of the layers from the p-type contact layer 9 to the n-type contact layer 4 are partially removed. An n-side electrode 12 of Al having a thickness of about 500 nm is formed on the exposed surface portion of the n-type contact layer 4.

Results of comparison of sheet resistance values of light-transmitting p-side electrodes similar to the p-side electrode 10 formed on the p-type contact layer 9 made of Mg-doped $Ga_{0.85}In_{0.15}N$ according to the first embodiment and other light-transmitting p-side electrodes similar to the p-side electrode 10 formed on a p-type contact layer of GaN according to comparative example are now described with reference to Table 1.

TABLE 1

| Electrode Material | Sheet Resistance of p-Side Electrode ($\Omega/cm^2$) | |
| --- | --- | --- |
|  | p-Type GaN Layer | p-Type GaInN Layer |
| Au(4 nm)/Pd(2 nm) | 41.1 | 20.1 |
| Ni(2 nm)/Au(4 nm)/Pd(2 nm) | 41.8 | 20.5 |
| Pd(10 nm) | ∞ | 22.4 |

In this experiment, currents of 10 mA were fed at a probe interval of 0.8 mm by a four-probe method, in order to measure the sheet resistance values of the p-side electrodes. The light-transmitting p-side electrodes were formed by three types of metal films of Au (4 nm)/Pd (2 nm), Ni (2 nm)/Au (4 nm)/Pd (2 nm) and Pd (10 nm) similar in structure to the p-side electrode 10 according to the first embodiment.

On the p-type contact layer of GaN according to comparative example, the p-side electrodes of Au/Pd and Ni/Au/Pd exhibited high sheet resistance values of 41.1 $\Omega/cm^2$ and 41.8 $\Omega/cm^2$ respectively. The p-side electrode of Pd exhibited high sheet resistance exceeding the limit of measurement.

On the p-type contact layer 9 of $Ga_{0.85}In_{0.15}N$ according to the first embodiment, on the other hand, the p-side electrode 10 of Au/Pd exhibited low sheet resistance of 20.1 $\Omega/cm^2$. The p-side electrodes of Ni/Au/Pd and Pd also exhibited low sheet resistance values of about 20 $\Omega/cm^2$. Thus, it has been proved from the experimental data that the sheet resistance of the p-side electrode 10 is reduced as compared with the prior art when employing the p-type contact layer 9 of $Ga_{0.85}In_{0.15}N$ according to the first embodiment.

When a forward voltage was applied across a sample of the p-side pad electrode 11 and the n-side electrode 12 in a sample of the light-emitting diode device according to the first embodiment, emission of a blue region having a wavelength of about 470 nm was obtained. It has also been proved that luminous intensity is improved to about twice in this case as compared with the case of forming the p-side electrode on the p-type contact layer of GaN according to comparative example.

In the aforementioned experiment, p-side electrodes of Pd having a large thickness of 100 nm exhibited low sheet resistance values of 1.6 $\Omega/cm^2$ in both of comparative example and the first embodiment. However, the p-side electrodes of Pd having the thickness of 100 nm were substantially opaque. In order to provide the p-side electrode with excellent transparency, therefore, it is preferable to form the p-side electrode in the thickness of not more than 10 nm, as shown in Table 1.

According to the first embodiment, the p-type contact layer 9 of $Ga_{0.85}In_{0.15}N$ having a smaller band gap than GaN is so provided that the carrier concentration of the p-type contact layer 9 is higher than that of a p-type contact layer of GaN, as hereinabove described. Thus, the band structure on the interface between the p-type contact layer 9 and the p-side electrode 10 can be changed. Therefore, the contact resistance between the p-type contact layer 9 and the light-transmitting p-side electrode 10 can be reduced. Consequently, homogeneous emission can be attained and a driving voltage can be reduced.

According to the first embodiment, further, the p-type contact layer 9 of $Ga_{0.85}In_{0.15}N$ having a smaller band gap than GaN is so provided that the electric conductivity of the p-type contact layer 9 is higher than that of the p-type contact layer of GaN, as hereinabove described. Thus, a current readily homogeneously spreads in the p-type contact layer 9, whereby homogeneous emission can be attained.

According to the first embodiment, in addition, the p-type intermediate layer 8 of GaN formed between the p-type cladding layer 7 and the p-type contact layer 9 has the intermediate band gap between those of the p-type contact layer 9 of $Ga_{0.85}In_{0.15}N$ and the p-type cladding layer 7 of $Al_{0.05}Ga_{0.95}N$ as hereinabove described, whereby the p-type intermediate layer 8 can reduce height of discontinuity of the band gaps of the p-type contact layer 9 and the p-type cladding layer 7. Thus, resistance against the current flowing from the p-type contact layer 9 to the p-type cladding layer 7 can be reduced. Consequently, luminous efficiency can be improved.

A method of fabricating the light-emitting diode device (blue LED chip) according to the first embodiment is now described with reference to FIGS. 1 and 2. First, the low-temperature buffer layer 2 of non-single-crystalline AlGaN is formed on the sapphire substrate 1 by MOVPE (metal organic vapor phase epitaxy) with carrier gas ($H_2$: about 50%) of $H_2$ and $N_2$ and material gas of $NH_3$, trimethyl aluminum (TMAl) and trimethyl gallium (TMGa) while holding the sapphire substrate 1 at a non-single crystal growth temperature of about 600° C., for example.

Thereafter the high-temperature buffer layer 3 of single-crystalline undoped GaN is grown on the low-temperature buffer layer 2 with carrier gas ($H_2$: about 50%) of $H_2$ and $N_2$ and material gas of $NH_3$ and TMGa at a growth rate of about 1 $\mu m/h$. while holding the sapphire substrate 1 at a single crystal growth temperature of about 1150° C.

Then, the n-type contact layer 4 of single-crystalline Si-doped GaN is grown on the high-temperature buffer layer 3 with carrier gas ($H_2$: about 50%) of $H_2$ and $N_2$, material gas of $NH_3$ and TMGa and dopant gas of $SiH_4$ at a growth rate of about 3 $\mu m/h$. while holding the sapphire substrate 1 at a single crystal growth temperature of about 1150° C.

Then, the six barrier layers 5a of single-crystalline undoped GaN and the five well layers 5b of single-crystalline undoped $Ga_{0.65}In_{0.35}N$ are alternately grown on the n-type contact layer 4 with carrier gas ($H_2$: about 1% to about 5%) of $H_2$ and $N_2$ and material gas of $NH_3$, triethyl gallium (TEGa) and trimethyl indium (TMIn) at a growth rate of about 0.4 nm/s. while holding the sapphire substrate 1 at a single crystal growth temperature of about 850° C., thereby forming the MQW emission layer 5. Then, the protective layer 6 of single-crystalline undoped GaN is grown on the MQW emission layer 5 at a growth rate of about 0.4 nm/s.

Thereafter the p-type cladding layer 7 of single-crystalline Mg-doped $Al_{0.05}Ga_{0.95}N$ is formed on the protective layer 6 with carrier gas ($H_2$: about 1% to about 3%) of $H_2$ and $N_2$, material gas of $NH_3$, TMGa and TMAl and dopant gas of cyclopentadienyl magnesium ($Cp_2Mg$) at a growth rate of about 3 $\mu m/h$. while holding the sapphire substrate 1 at a single crystal growth temperature of about 1150° C. Then, the material gas is changed to that of $NH_3$ and TMGa, for forming the p-type intermediate layer 8 of single-crystalline Mg-doped GaN on the p-type cladding layer 7 at a growth rate of about 3 $\mu$m/h.

Then, the p-type contact layer 9 of Mg-doped $Ga_{0.85}In_{0.15}N$ is formed on the p-type intermediate layer 8 with carrier gas ($H_2$: about 1% to about 5%) of $H_2$ and $N_2$, material gas of $NH_3$, TEGa and TMIn and dopant gas of $Cp_2Mg$ at a growth rate of about 3 $\mu$m/h. while holding the sapphire substrate 1 at a single crystal growth temperature of about 850° C. According to the first embodiment, the p-type intermediate layer 8 of GaN including no Al composition is formed on the p-type cladding layer 7 of $Al_{0.05}Ga_{0.95}N$ when the growth temperature is reduced from about 1150° C. to about 850° C. in order to form the p-type contact layer 9, whereby the surface of the p-type cladding layer 7 can be prevented from degradation. Thus, the resistance against the current flowing from the p-type contact layer 9 to the p-type cladding layer 7 can be further reduced. Inequality of in-plane resistance resulting from degradation of the p-type cladding layer 7 can be reduced, whereby irregular emission can be reduced. Thus, homogeneous emission can be attained.

Thereafter the regions of the p-type contact layer 9, the p-type intermediate layer 8, the p-type cladding layer 7, the protective layer 6, the MQW emission layer 5 and the p-type contact layer 4 are partially removed by etching such as reactive ion beam etching (RIBE).

As shown in FIGS. 1 and 2, the p-side electrode 10 consisting of the Pd film 10a and the Au film 10b is formed substantially on the overall upper surface of the p-type contact layer 9 by vacuum deposition or the like. The p-side pad electrode 11 consisting of the Ti film 11a and the Au film 11b is formed on the p-side electrode 10. The n-side electrode 12 of Al is formed on the surface portion of the n-type contact layer 4 exposed by etching. Thereafter the chip is heat-treated at a temperature of about 600° C., thereby bringing the p-side electrode 10 and the n-side electrode 12 into ohmic contact with the p-type contact layer 9 and the n-type contact layer 4 respectively.

Finally, the device is cut into a substantially square chip having each side of about 400 $\mu$m in length, for example, by a method such as scribing, dicing or breaking. Thus, the light-emitting diode device (blue LED chip) according to the first embodiment is formed as shown in FIGS. 1 and 2.

The blue LED chip according to the first embodiment formed in the aforementioned manner may be employed as an LED lamp by fixing the blue LED chip according to the first embodiment to a frame and hardening molding resin at a temperature of about 200° C.

According to the first embodiment, the hydrogen composition of the carrier gas is lowered when crystal-growing the layers from the p-type cladding layer 7 up to the p-type contact layer 9 as hereinabove described, thereby activating the Mg dopant. Thus, the p-type semiconductor layers 7 to 9 can be obtained in high carrier concentrations.

(Second Embodiment)

Figure 3:
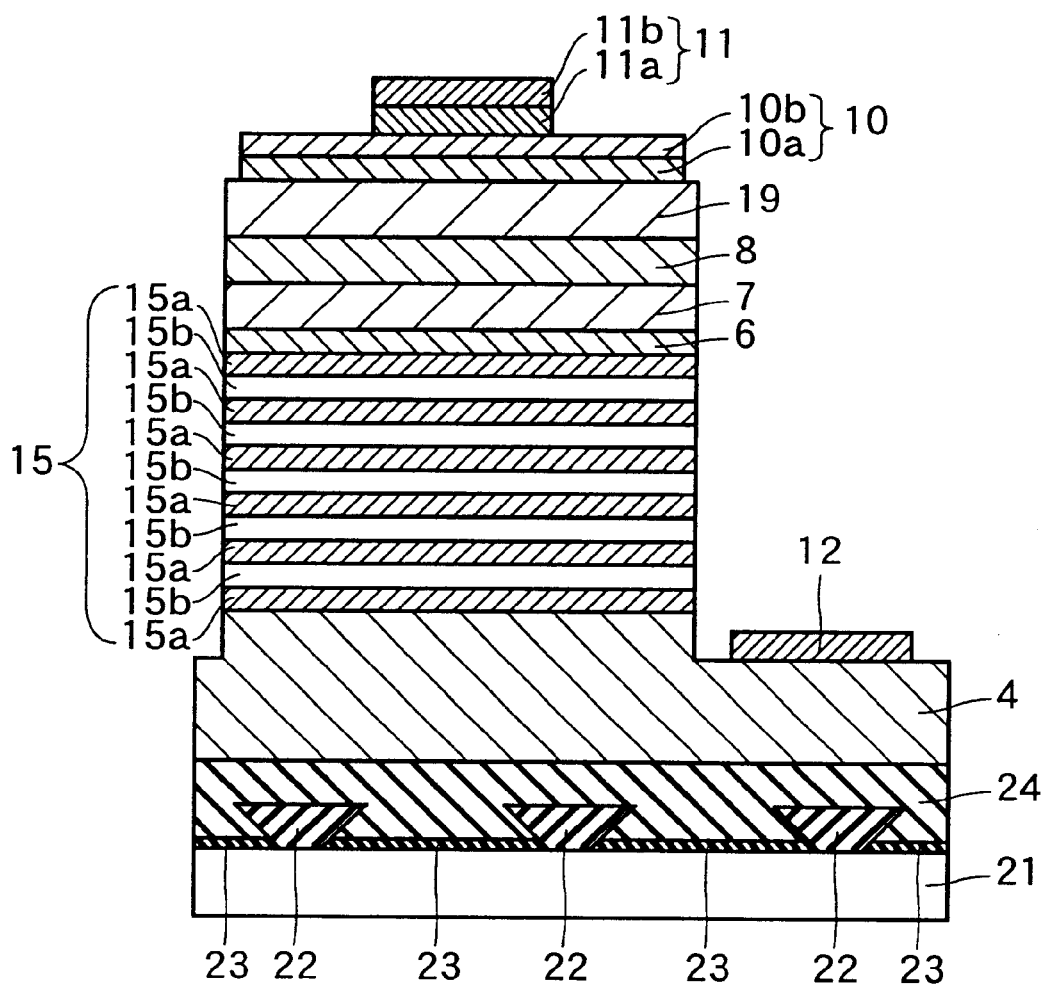
FIG. 3 is a sectional view showing a light-emitting diode device (ultraviolet LED chip) according to a second embodiment of the present invention.

Referring to FIG. 3, a light-emitting diode device according to a second embodiment of the present invention is provided with an undoped GaN layer 24, having a smaller density of dislocations than the high-temperature buffer layer 3 according to the first embodiment, formed under an n-type contact layer 4 similar to that according to the first embodiment.

The structure of the light-emitting diode device according to the second embodiment is described in detail with reference to FIG. 3. As shown in FIG. 3, inverse-mesa (inverse-trapezoidal) mask layers 22 of SiN having a thickness of about 10 nm to about 1000 nm are formed on a sapphire substrate 21 in the form of (elongated) stripes having a cycle of about 7 $\mu$m. The mask layers 22 are so formed that the minimum distance between the adjacent mask layers 22 is smaller than the width of portions of the sapphire substrate 21 exposed between the mask layers 22. The sapphire substrate 21 is an example of the "substrate" according to the present invention.

Low-temperature buffer layers 23 of AlGaN or GaN having a thickness of about 10 nm to about 50 nm are formed on the portions of the sapphire substrate 21 exposed between the mask layers 22. The undoped GaN layer 24 having a thickness of about 2 $\mu$m with the smaller density of dislocations than the high-temperature buffer layer 3 according to the first embodiment is formed on the low-temperature buffer layers 23 and the mask layers 22 to fill up openings between the mask layers 22.

The n-type contact layer 4 is formed on the undoped GaN layer 24 to have a projecting portion. A multiple quantum well (MQW) emission layer 15 is formed to be in contact substantially with the overall upper surface of the projecting portion of the n-type contact layer 4.

According to the second embodiment, the MQW emission layer 15 is formed by alternately stacking six barrier layers 15a of undoped GaN and five well layers 15b of undoped $Ga_{0.1}In_{0.9}N$. The MQW emission layer 15 having such a composition can emit ultraviolet light. The MQW emission layer 15 is an example of the "emission layer" according to the present invention.

A protective layer 6, a p-type cladding layer 7 and a p-type intermediate layer 8 are formed on the MQW emission layer 15. A p-type contact layer 19 of Mg-doped $Ga_{0.92}In_{0.08}N$ having a thickness of about 0.3 $\mu$m with a dose of about $5 \times 10^{19}$ cm$^{-3}$ and a carrier concentration of about $7 \times 10^{18}$ cm$^{-3}$ is formed on the p-type intermediate layer 8. The p-type contact layer 19 is an example of the "contact layer" according to the present invention. The layers 4 and 6 to 8 are similar in composition to those of the first embodiment.

According to the second embodiment, the p-type intermediate layer 8 of GaN has an intermediate band gap between the band gaps of the p-type cladding layer 7 of $Al_{0.05}Ga_{0.95}N$ and the p-type contact layer 19 of $Ga_{0.92}In_{0.08}N$.

A p-side electrode 10 formed by a Pd film 10a having a thickness of about 2 nm and an Au film 10b having a thickness of about 4 nm and a p-side pad electrode 11 formed by a Ti film 11a having a thickness of about 30 nm and an Au film 11b having a thickness of about 500 nm are formed on the upper surface of the p-type contact layer 19, similarly to the first embodiment. An n-side electrode 12 of Al having a thickness of about 500 nm is formed on a surface portion of the n-type contact layer 4 exposed by removing a partial region.

When a forward voltage was applied across a sample the p-side pad electrode 11 and the n-side electrode 12 in the aforementioned light-emitting diode device according to the second embodiment, emission of the ultraviolet region having a wavelength of about 390 nm was obtained. It has been proved that luminous efficiency is improved to about twice when forming the p-side electrode 10 on the p-type contact layer 19 of $Ga_{0.92}In_{0.08}N$ according to the second embodiment, as compared with a case of forming the p-side electrode 10 on a p-type contact layer of GaN.

According to the second embodiment, the layers 4, 6 to 8, 15 and 19 and the electrodes 10 to 12 are formed on the undoped GaN layer 24 having a smaller density of dislocations as compared with the high-temperature buffer layer 3 according to the first embodiment as hereinabove described, whereby an ultraviolet LED chip having high luminous efficiency can be formed.

According to the second embodiment, the p-type contact layer 19 of $Ga_{0.92}In_{0.8}N$ having a smaller band gap than GaN is so provided that the carrier concentration of the p-type contact layer 19 is higher than that a p-type contact layer of GaN, similarly to the first embodiment. Thus, the band structure on the interface between the p-type contact layer 19 and the p-side electrode 10 can be changed. Therefore, the contact resistance between the p-type contact layer 19 and the light-transmitting p-side electrode 10 can be reduced. Consequently, homogeneous emission can be attained and a driving voltage can be reduced.

According to the second embodiment, further, the p-type contact layer 19 of $Ga_{0.92}In_{0.08}N$ having a smaller band gap than GaN is so provided that the electric conductivity of the p-type contact layer 19 can be higher than that of the p-type contact layer of GaN, as hereinabove described. Thus, a current readily homogeneously spreads in the p-type contact layer 19, whereby homogeneous emission can be attained.

According to the second embodiment, in addition, the p-type intermediate layer 8 of GaN formed between the p-type cladding layer 7 and the p-type contact layer 19 has the intermediate band gap between those of the p-type contact layer 19 of $Ga_{0.92}In_{0.08}N$ and the p-type cladding layer 7 $Al_{0.05}Ga_{0.95}N$ as hereinabove described, whereby the p-type intermediate layer 8 can reduce height of discontinuity of the band gaps of the p-type contact layer 19 and the p-type cladding layer 7. Thus, resistance against the current flowing from the p-type contact layer 19 to the p-type cladding layer 7 can be reduced. Consequently, luminous efficiency can be improved.

A method of fabricating the light-emitting diode device (ultraviolet LED chip) according to the second embodiment is now described with reference to FIGS. 3 to 6.

Figure 4:
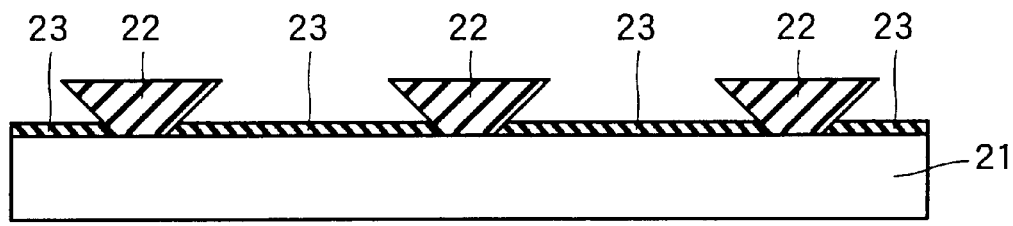
FIGS. 4 to 6 are sectional views for illustrating a method of forming the light-emitting diode device (ultraviolet LED chip) according to the second embodiment of the present invention.

First, an SiN film (not shown) is formed on the overall upper surface of the sapphire substrate 21, followed by formation of a resist film (not shown) on a prescribed region of the SiN film. The SiN film is wet-etched through the resist film serving as a mask, thereby forming the striped mask layers 22 as shown in FIG. 4. The mask layers 22 are formed in inverse-mesa shapes (inverse-trapezoidal shapes) to have overhangs between obliquely formed side surfaces thereof and the sapphire substrate 21. Openings of the mask layers 22 are preferably formed in the [11-20] direction or the [1-100] direction of the sapphire substrate 21, for example.

Thereafter the low-temperature buffer layers 23 of AlGaN or GaN are grown on the portions of the sapphire substrate 21 exposed between the mask layers 22 at a growth temperature of about 500° C. to about 700° C., as shown in FIG. 4.

Figure 5:
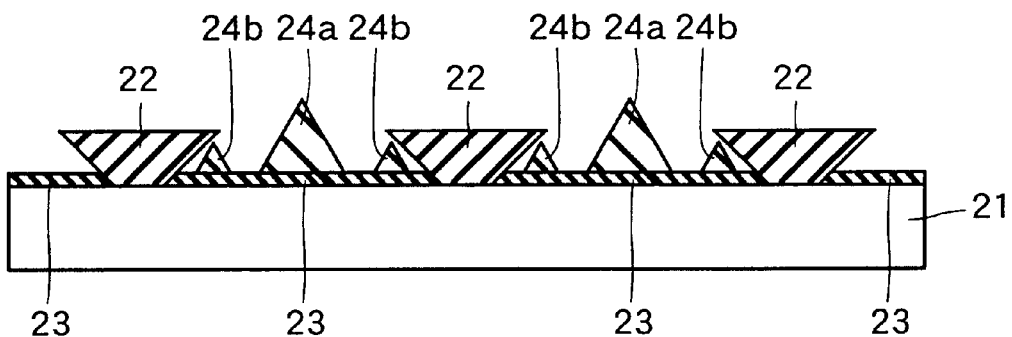

Then, the undoped GaN layer 24 is selectively laterally grown on the low-temperature buffer layers 23 through the mask layers 22 serving as lateral growth masks by MOVPE or HVPE (hydride vapor phase epitaxy) at a growth temperature of about 950° C. to about 1200° C., as shown in FIG. 5. In this case, the undoped GaN layer 24 is first grown upward on the exposed upper surfaces of the low-temperature buffer layers 23. Thus, undoped GaN layers 24a having a facet structure with a triangular section are grown around the centers of the upper surfaces of the low-temperature buffer layers 23, while small undoped GaN layers 24b having a facet structure are formed on portions of the upper surfaces of the low-temperature buffer layers 23 located under the overhangs.

Figure 6:
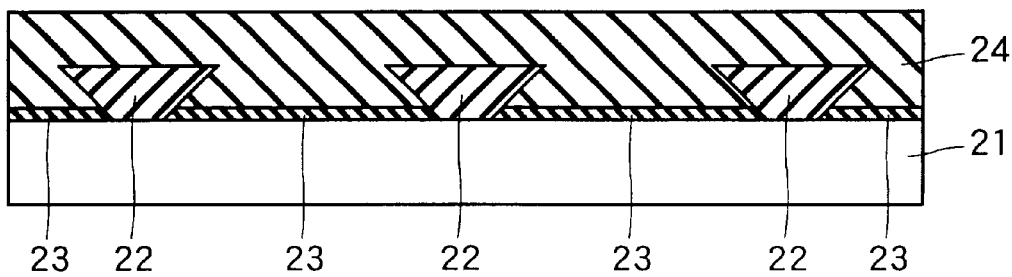

As the growth of the facets consisting of the undoped GaN layers 24a and 24b progresses, the undoped GaN layers 24a and 24b are laterally grown to coalesce with each other while growing also on the mask layers 22. Thus, the undoped GaN layer 24 is formed as a continuous film having a flat upper surface, as shown in FIG. 6.

According to the second embodiment, the undoped GaN layer 24 is formed on the sapphire substrate 21 through the low-temperature buffer layers 23 to be prompted in crystal growth, whereby a large number of small facets consisting of the undoped GaN layers 24b can be formed on the portions of the upper surfaces of the low-temperature buffer layers 23 located under the overhangs. When the large number of small facets consisting of the undoped GaN layers 24b are formed on the upper surfaces of the low-temperature buffer layers 23, lateral growth of the undoped GaN layer 24 is dominant from the initial stage of the growth. Thus, a larger number of dislocations are laterally bent, whereby the dislocation density of the undoped GaN layer 24 can be reduced to about $7 \times 10^7$ cm$^{-2}$ with a smaller thickness.

Then, the n-type contact layer 4, the MQW emission layer 15, the protective layer 6, the p-type cladding layer 7, the p-type intermediate layer 8 and the p-type contact layer 19 consisting of the Mg-doped $Ga_{0.92}In_{0.08}N$ having the carrier concentration of $5 \times 10^{18}$ cm$^{-3}$ are formed on the undoped GaN layer 24 through a process similar to that for forming the layers 4 to 9 according to the first embodiment shown in FIG. 1. Thereafter the regions of the p-type contact layer 19, the p-type intermediate layer 8, the p-type cladding layer 7, the protective layer 6, the MQW emission layer 15 and the n-type contact layer 4 are partially removed by etching. The p-side electrode 10 and the p-side pad electrode 11 are formed on the p-type contact layer 19 while forming the n-side electrode 12 on the surface portion of the n-type contact layer 4 exposed by etching through a process similar to that forming the electrodes 10 to 12 according to the first embodiment.

Also in the process according to the second embodiment, the p-type intermediate layer 8 of GaN including no Al composition is formed on the p-type cladding layer 7 of $Al_{0.05}Ga_{0.95}N$ when the growth temperature is reduced from about 1150° C. to about 850° C. for forming the p-type contact layer 19, whereby the surface of the p-type cladding layer 7 can be prevented from degradation. Thus, the resistance against the current flowing from the p-type contact layer 19 to the p-type cladding layer 7 can be further reduced. Further, inequality of in-plane resistance resulting from degradation of the p-type cladding layer 7 can be so reduced that irregular emission can be prevented. Thus, homogeneous emission can be attained.

Finally, the device is cut into a substantially square chip having each side of about 400 μm in length, for example, by a method such as scribing, dicing or breaking, similarly to the first embodiment. Thus, the light-emitting diode device (ultraviolet LED chip) according to the second embodiment is formed as shown in FIG. 3.

(Third Embodiment)

Figure 7:
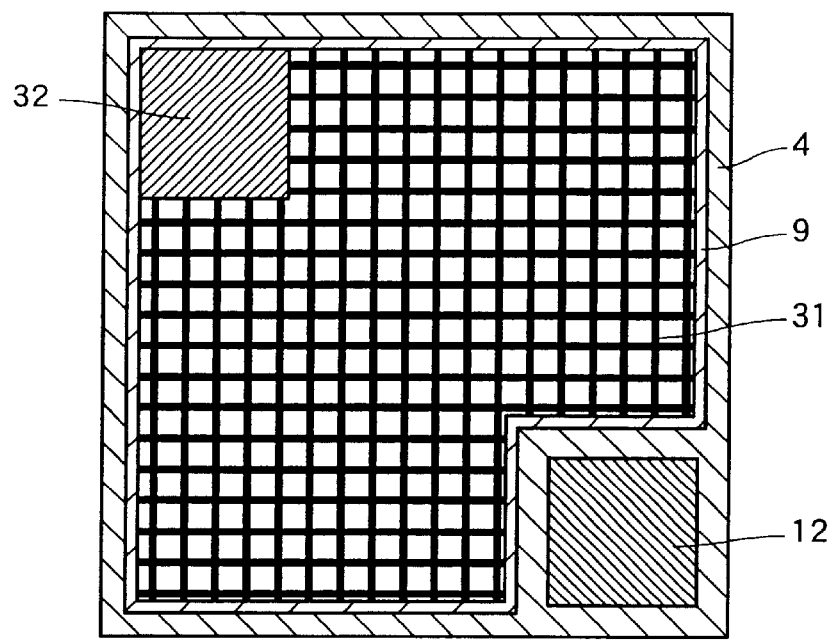
FIG. 7 is a top plan view of a light-emitting diode device according to a third embodiment of the present invention.

Referring to FIG. 7, a light-emitting diode device according to a third embodiment of the present invention is provided with a mesh p-side electrode 31, in place of the p-side electrode 10 according to the first embodiment. The light-emitting diode device according to the third embodiment is now described in detail.

According to the third embodiment, the p-side electrode 31 consisting of a Pd film having a thickness of about 100 nm and an Au film, formed on the Pd film, having a thickness of about 100 nm is formed on a p-type contact layer 9 by vacuum deposition to cover about 10% of the upper surface of the p-type contact layer 9, as shown in FIG. 7. This p-side electrode 31 is so meshed as to have a light transmittable window formed with no electrode between electrodes. In other words, the Pd film and the Au film forming the p-side electrode 31 are formed to have an electrode width of about 20 µm and a window width of about 50 µm. A p-side pad electrode 32 formed by a Ti film having a thickness of about 30 nm and an Au film having a thickness of about 500 nm is provided on part of the upper surface of the p-side electrode 31. The p-side electrode 31 is an example of the "light-transmitting electrode" according to the present invention. The structure of the light-emitting diode device according to the third embodiment except the p-side electrode 31 and the p-side pad electrode 32 is similar to that of the light-emitting diode device according to the first embodiment shown in FIG. 1.

In this case, diffusion of a current in the p-type contact layer 9 can be increased by preparing the p-type contact layer 9 from $Ga_{0.85}In_{0.15}N$ having a high carrier concentration, whereby the current can be fed substantially to the overall surface of the p-type contact layer 9 by sufficiently reducing the window width of the p-side electrode 31.

According to the third embodiment, the mesh p-side electrode 31 is so formed on the p-type contact layer 9 as to have the window formed with no electrode as hereinabove described, whereby light transmittance can be improved in the window. Thus, the light transmittance can be improve in the overall p-side electrode 31.

According to the third embodiment, further, the mesh p-side electrode 31 is so formed on the p-type contact layer 9 as to have the window formed with no electrode as hereinabove described, whereby the portion of the p-side electrode 31 other than the window can be formed with a large thickness of about 200 nm. Thus, sheet resistance of the p-side electrode 31 can be further reduced.

According to the third embodiment, the p-type contact layer 9 of $Ga_{0.85}In_{0.15}N$ having a smaller band gap than GaN is so provided that the carrier concentration of the p-type contact layer 9 can be higher than that of a p-type contact layer of GaN, similarly to the first embodiment. Thus, the band structure on the interface between the p-type contact layer 9 and the p-side electrode 31 can be changed. Therefore, the contact resistance between the p-type contact layer 9 and the light-transmitting p-side electrode 31 can be reduced. Consequently, homogeneous emission can be attained while a driving voltage can be reduced.

According to the third embodiment, the p-type contact layer 9 of $Ga_{0.85}In_{0.15}N$ having a smaller band gap than GaN is so provided that the electric conductivity of the p-type contact layer 9 can be higher than that of the p-type contact layer of GaN, similarly to the first embodiment. Thus, the current readily homogeneously spreads in the p-type contact layer 9, whereby homogeneous emission can be attained.

According to the third embodiment, further, a p-type intermediate layer 8 of GaN formed between a p-type cladding layer 7 and the p-type contact layer 9 has an intermediate band gap between those of the p-type contact layer 9 of $Ga_{0.85}In_{0.15}N$ and the p-type cladding layer 7 of $Al_{0.05}Ga_{0.95}N$, whereby the p-type intermediate layer 8 can reduce height of discontinuity of the band gaps of the p-type contact layer 9 and the p-type cladding layer 7. Thus, the resistance against the current flowing from the p-type contact layer 9 to the p-type cladding layer 7 can be reduced. Consequently, luminous efficiency can be improved.

(Fourth Embodiment)

Figure 8:
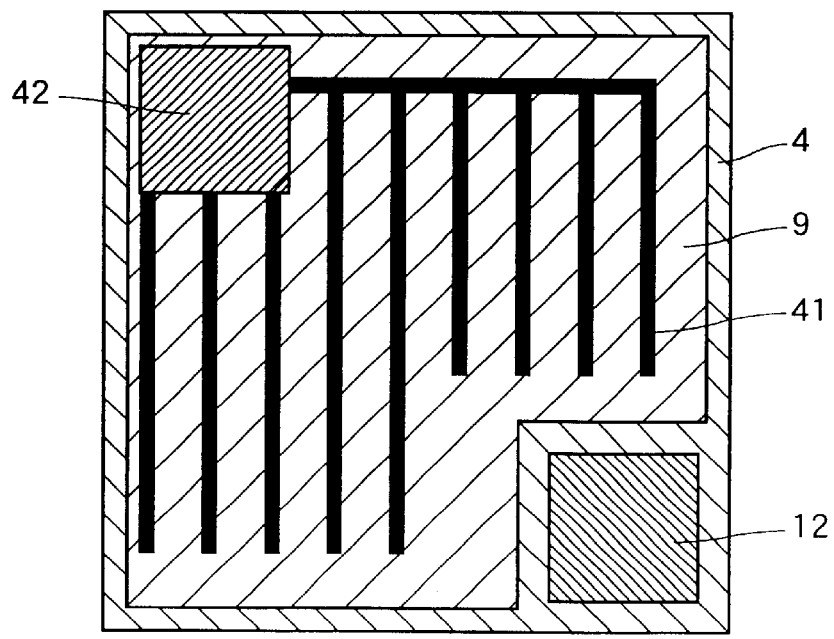
FIG. 8 is a top plan view of a light-emitting diode device according to a fourth embodiment of the present invention.

Referring to FIG. 8, a light-emitting diode device according to a fourth embodiment of the present invention is provided with a comb-shaped p-side electrode 41, in place of the p-side electrode 10 according to the first embodiment. The light-emitting diode device according to the fourth embodiment is now described in detail.

According to the fourth embodiment, the comb-shaped p-side electrode 41 consisting of a Pd film having a thickness of about 100 nm and an Au film, formed on the Pd film, having a thickness of about 100 nm is formed on a p-type contact layer 9, as shown in FIG. 8. A p-side pad electrode 42 formed by a Ti film having a thickness of about 30 nm and an Au film having a thickness of about 500 nm is formed on part of the upper surface of the p-side electrode 41. The p-side electrode 41 is an example of the "light-transmitting electrode" according to the present invention. The structure of the light-emitting diode device according to the forth embodiment other than the portions of the p-side electrode 41 and the p-side pad electrode 42 is similar to that of the light-emitting diode device according to the first embodiment shown in FIG. 1.

According to the fourth embodiment, the comb-shaped p-side electrode 41 is so formed on the p-type contact layer 9 to have a region formed with no electrode as described above, whereby light transmittance can be improved in the region formed with no p-side electrode 41. Thus, the light transmittance can be improved in the overall p-side electrode 41.

According to the fourth embodiment, further, the comb-shaped p-side electrode 41 is so formed on the p-type contact layer 9 as to have the region formed with no electrode as described above, whereby the p-side electrode 41 can be formed with a large thickness of about 200 nm. Thus, sheet resistance of the p-side electrode 41 can be further reduced.

According to the fourth embodiment, the p-type contact layer 9 of $Ga_{0.85}In_{0.15}N$ having a smaller band gap than GaN is so provided that the carrier concentration of the p-type contact layer 9 can be higher than that of a p-type contact layer of GaN, similarly to the first embodiment. Thus, the band structure on the interface between the p-type contact layer 9 and the p-side electrode 41 can be changed. Therefore, the contact resistance between the p-type contact layer 9 and the light-transmitting p-side electrode 41 can be reduced. Consequently, homogeneous emission can be attained while a driving voltage can be reduced.

According to the fourth embodiment, the p-type contact layer 9 of $Ga_{0.85}In_{0.15}N$ having a smaller band gap than GaN is so provided that the electric conductivity of the p-type contact layer 9 can be higher than that of the p-type contact layer of GaN, similarly to the first embodiment. Thus, a current readily homogeneously spreads in the p-type contact layer 9, whereby homogeneous emission can be attained.

According to the fourth embodiment, further, a p-type intermediate layer 8 of GaN formed between a p-type cladding layer 7 and the p-type contact layer 9 has an intermediate band gap between those of the p-type contact layer 9 of $Ga_{0.85}In_{0.15}N$ and the p-type cladding layer 7 of $Al_{0.05}Ga_{0.95}N$, whereby the p-type intermediate layer 8 can reduce height of discontinuity of the band gaps of the p-type contact layer 9 and the p-type cladding layer 7. Thus, the resistance against the current flowing from the p-type contact layer 9 to the p-type cladding layer 7 can be reduced. Consequently, luminous efficiency can be improved.

(Fifth Embodiment)

Figure 9:
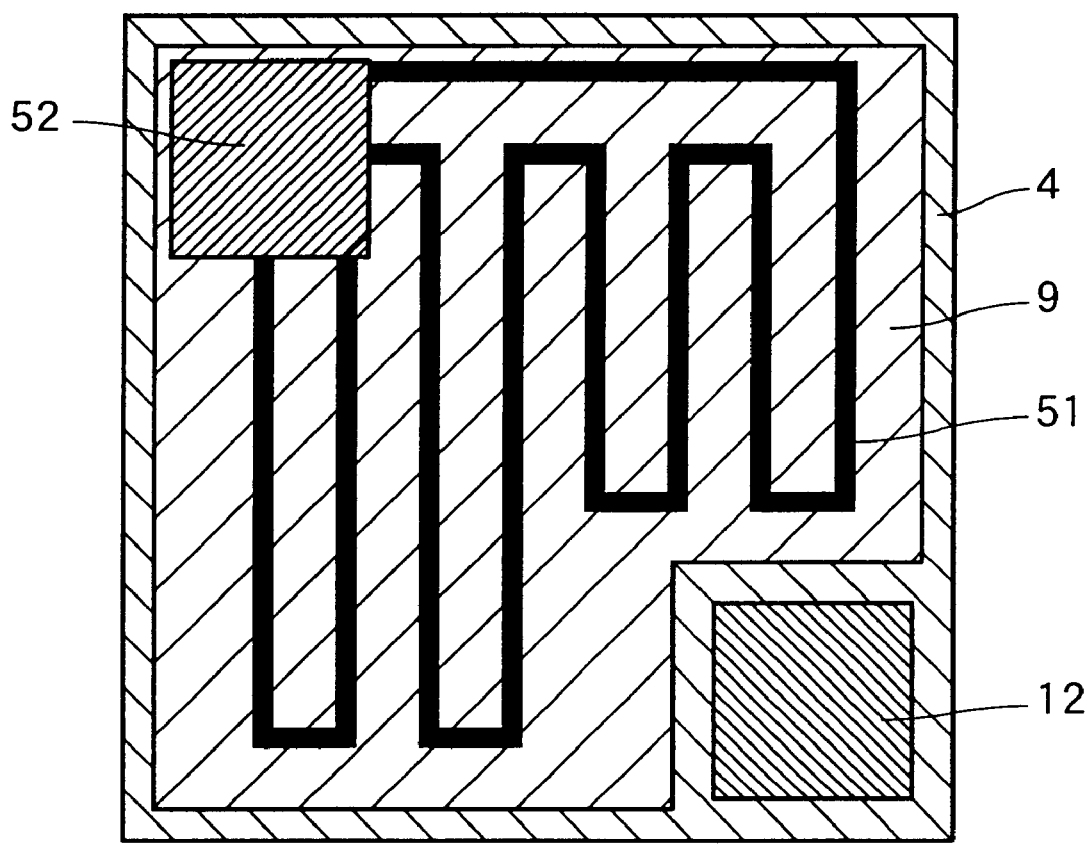
FIG. 9 is a top plan view of a light-emitting diode device according to a fifth embodiment of the present invention.

Referring to FIG. 9, a light-emitting diode device according to a fifth embodiment of the present invention is provided with a meander p-side electrode 51, in place of the p-side electrode 10 according to the first embodiment. The light-emitting diode device according to the fifth embodiment is now described in detail.

According to the fifth embodiment, the p-side electrode 51 consisting of a Pd film having a thickness of about 100 nm and an Au film, formed on the Pd film, having a thickness of about 100 nm is formed on a p-type contact layer 9 to meander on the p-type contact layer 9, as shown in FIG. 9. A p-side pad electrode 52 formed by a Ti film having a thickness of about 30 nm and an Au film having a thickness of about 500 nm is formed on part of the upper surface of the p-side electrode 51. The p-side electrode 51 is an example of the "light-transmitting electrode" according to the present invention. The structure of the light-emitting diode device according to the fifth embodiment other than the portions of the p-side electrode 51 and the p-side pad electrode 52 is similar to that of the light-emitting diode device according to the first embodiment shown in FIG. 1.

According to the fifth embodiment, the meander p-side electrode 51 is so formed on the p-type contact layer 9 as to have a region formed with no electrode as described above, whereby light transmittance can be improved in the region formed with no p-side electrode 51. Thus, the light transmittance can be improved in the overall p-side electrode 51.

According to the fifth embodiment, further, the meander p-side electrode 51 is so formed on the p-type contact layer 9 as to have the region formed with no electrode as described above, whereby the p-side electrode 51 can be formed with a large thickness of about 200 nm. Thus, sheet resistance of the p-side electrode 51 can be further reduced.

According to the fifth embodiment, the p-type contact layer 9 of $Ga_{0.85}In_{0.15}N$ having a smaller band gap than GaN is so provided that the carrier concentration of the p-type contact layer 9 can be higher than that of a p-type contact layer of GaN, similarly to the first embodiment. Thus, the band structure on the interface between the p-type contact layer 9 and the p-side electrode 41 can be changed. Therefore, the contact resistance between the p-type contact layer 9 and the light-transmitting p-side electrode 51 can be reduced. Consequently, homogeneous emission can be attained while a driving voltage can be reduced.

According to the fifth embodiment, the p-type contact layer 9 of $Ga_{0.85}In_{0.15}N$ having a smaller band gap than GaN is so provided that the electric conductivity of the p-type contact layer 9 can be higher than that of the p-type contact layer of GaN, similarly to the first embodiment. Thus, a current readily homogeneously spreads in the p-type contact layer 9, whereby homogeneous emission can be attained.

According to the fifth embodiment, further, a p-type intermediate layer 8 of GaN formed between a p-type cladding layer 7 and the p-type contact layer 9 has an intermediate band gap between those of the p-type contact layer 9 of $Ga_{0.85}In_{0.15}N$ and the p-type cladding layer 7 of $Al_{0.05}Ga_{0.95}N$, whereby the p-type intermediate layer 8 can reduce height of discontinuity of the band gaps of the p-type contact layer 9 and the p-type cladding layer 7. Thus, the resistance against the current flowing from the p-type contact layer 9 to the p-type cladding layer 7 can be reduced. Consequently, luminous efficiency can be improved.

(Sixth Embodiment)

Figure 10:
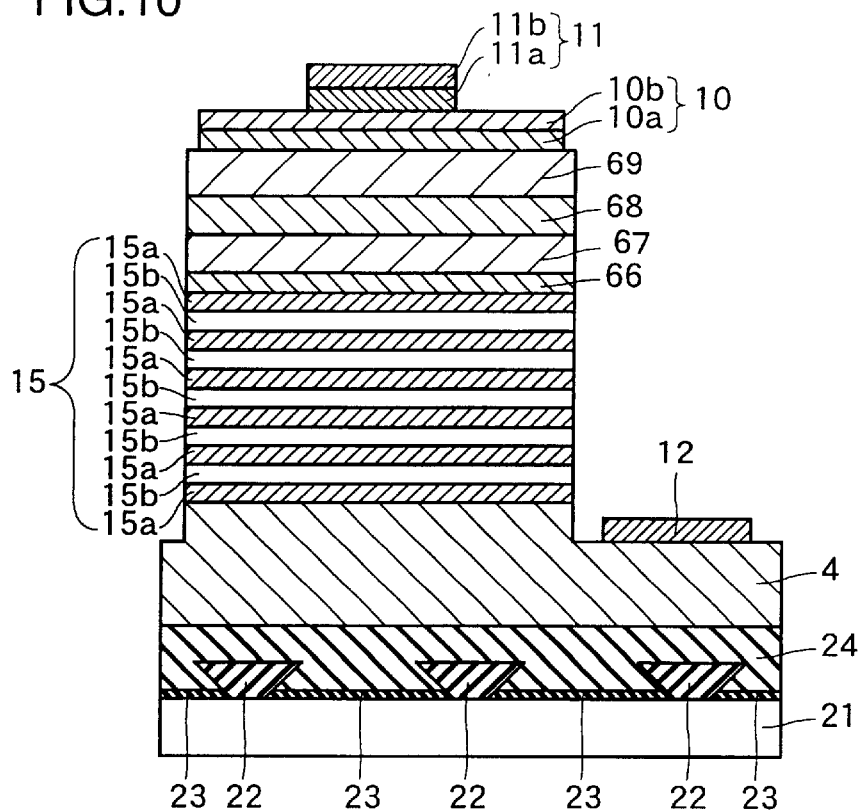
FIG. 10 is a sectional view showing a light-emitting diode device (ultraviolet LED chip) according to a sixth embodiment of the present invention.
Figure 11:
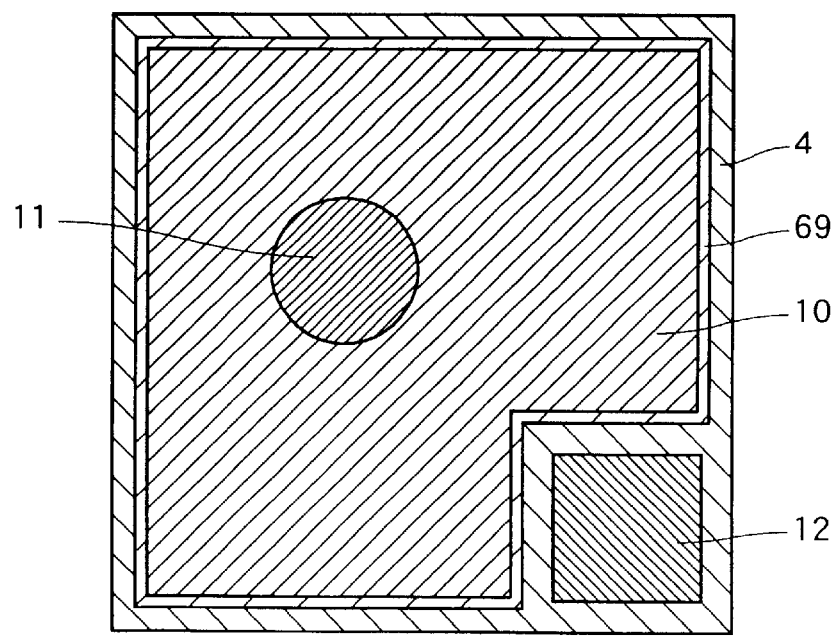
FIG. 11 is a top plan view of the light-emitting diode device (ultraviolet LED chip) shown in FIG. 10.

Referring to FIGS. 10 and 11, a protective layer 66, a p-type intermediate layer 68 and a p-type contact layer 69 of a light-emitting diode device according to a sixth embodiment of the present invention have different compositions from those in the aforementioned second embodiment. The light-emitting diode device according to the sixth embodiment is now described in detail.

Referring to FIGS. 10 and 11, the structure of the light-emitting diode device according to the sixth embodiment is described in detail. According to the sixth embodiment, inverse-mesa (inverse-trapezoidal) mask layers 22 of SiN having a thickness of about 10 nm to about 1000 nm are formed on the (0001) plane of a sapphire substrate 21 in the form of (elongated) stripes having a cycle of about 7 $\mu$m, as shown in FIG. 10. The mask layers 22 are so formed that the minimum distance between the adjacent mask layers 22 is smaller than the width of portions of the sapphire substrate 21 exposed between the mask layers 22.

Low-temperature buffer layers 23 of AlGaN or GaN having a thickness of about 10 nm to about 50 nm are formed on the portions of the sapphire substrate 21 exposed between the mask layers 22. An undoped GaN layer 24 having a thickness of about 2 $\mu$m and a smaller density of dislocations as compared with the high-temperature buffer layer 3 according to the first embodiment is formed on the low-temperature buffer layers 23 and the mask layers 22.

An n-type contact layer 4 consisting of Ge-doped GaN having a projecting portion of about 5 $\mu$m in thickness is formed on the undoped GaN layer 24. This n-type contact layer 4 is formed to serve also as an n-type cladding layer.

An MQW emission layer 15 is formed to be in contact substantially with the overall upper surface of the projecting portion of the n-type contact layer 4. The MQW emission layer 15 is formed by alternately stacking six barrier layers 15a of undoped GaN having a thickness of about 5 nm and five well layers 15b of undoped $Ga_{0.1}In_{0.9}N$ having a thickness of about 5 nm. The MQW emission layer 15 having such a composition can emit ultraviolet light.

According to the sixth embodiment, the protective layer 66 of Mg-doped $Al_{0.2}Ga_{0.8}N$ having a thickness of about 10 nm is formed on the MQW emission layer 15, for preventing the MQW emission layer 15 from deterioration. A p-type cladding layer 67 of Mg-doped $Al_{0.05}Ga_{0.95}N$ having a thickness of about 0.15 $\mu$m with a dose of about $7\times10^{19}$ cm$^{-3}$ and a carrier concentration of about $2\times10^{18}$ cm$^{-3}$ and the p-type intermediate layer 68 of undoped $Al_{0.01}Ga_{0.99}N$ having a thickness of about 70 nm and a carrier concentration of about $2\times10^{18}$ cm$^{-3}$ are formed on the protective layer 66 in this order. The p-type cladding layer 67 is an example of the "second nitride-based semiconductor layer" and the "cladding layer" according to the present invention, and the p-type intermediate layer 68 is an example of the "intermediate layer" according to the present invention. The p-type contact layer 69 of undoped $Ga_{0.92}In_{0.08}N$ having a thickness of about 3 nm and a carrier concentration of about $5\times10^{18}$ cm$^{-3}$ is formed on the p-type intermediate layer 68. The p-type contact layer 69 is an example of the "contact layer" according to the present invention.

According to the sixth embodiment, the p-type intermediate layer 68 and the p-type contact layer 69 are undoped as described above. In this case, the p-type cladding layer 67 supplies holes to the p-type intermediate layer 68 and the p-type contact layer 69 due to an effect of modulation doping, whereby the p-type intermediate layer 68 and the p-type contact layer 69 exhibit the p-type conductivity.

According to the sixth embodiment, the p-type intermediate layer 68 of $Al_{0.01}Ga_{0.99}N$ has an intermediate band gap between those of the p-type cladding layer 67 of $Al_{0.05}Ga_{0.95}N$ and the p-type contact layer 69 of $Ga_{0.92}In_{0.08}N$.

A p-side electrode 10 formed by a Pd film 10a having a thickness of about 2 nm and an Au film 10b having a thickness of about 4 nm is formed on the upper surface of the p-type contact layer 69. The p-side electrode 10 is formed in a small thickness of about 6 nm in total, to have light transmittance.

As shown in FIGS. 10 and 11, a p-side pad electrode 11 formed by a Ti film 11a having a thickness of about 30 nm and an Au film 11b having a thickness of about 500 nm is formed on part of the upper surface of the p-side electrode 10. Regions of the layers from the p-type contact layer 69 to the n-type contact layer 4 are partially removed. An n-side electrode 12 of Al having a thickness of about 500 nm is formed on the exposed surface of the n-type contact layer 4.

According to the sixth embodiment, the p-type intermediate layer 68 of $Al_{0.05}Ga_{0.99}N$ formed between the p-type cladding layer 67 and the p-type contact layer 69 has the intermediate band gap between those of the p-type contact layer 69 of $Ga_{0.92}In_{0.08}N$ and the p-type cladding layer 67 of $Al_{0.05}Ga_{0.95}N$, whereby the p-type intermediate layer 68 can reduce height of discontinuity of the band gaps of the p-type contact layer 69 and the p-type cladding layer 67. Thus, resistance against a current flowing from the p-type contact layer 69 to the p-type cladding layer 67 can be reduced. Consequently, luminous efficiency can be improved.

According to the sixth embodiment, an ultraviolet LED chip having high luminous efficiency can be prepared by forming the layers 4, 15, 66, 67, 68 and 69 and the electrodes 10 to 12 on the undoped GaN layer 24 having a smaller density of dislocations as compared with the high-temperature buffer layer 3 according to the first embodiment, similarly to the second embodiment.

According to the sixth embodiment, the carrier concentration of the p-type contact layer 69 of $Ga_{0.92}In_{0.08}N$ having a smaller band gap than GaN can be rendered higher than that of a p-type contact layer consisting of GaN. Thus, the band structure on the interface between the p-type contact layer 69 and the p-side electrode 10 can be changed. Therefore, contact resistance between the p-type contact layer 69 and the p-side electrode 10 having light transmittance can be reduced. Consequently, homogeneous emission can be attained and a driving voltage can be reduced.

According to the sixth embodiment, the p-type contact layer 69 of $Ga_{0.92}In_{0.08}N$ having a smaller band gap than GaN is so provided that the electric conductivity of the p-type contact layer 69 can be higher than that of the p-type contact layer of GaN, similarly to the second embodiment. Thus, the current readily homogeneously spreads in the p-type contact layer 69, whereby homogeneous emission can be attained.

A method of fabricating the light-emitting diode device (ultraviolet LED chip) according to the sixth embodiment is now described with reference to FIGS. 10 and First, the layers 22 to 24 and 4 are formed on the sapphire substrate 21 through a fabrication process similar to that according to the second embodiment.

Then, the six barrier layers 15a of single-crystalline undoped GaN and the five well layers 15b of single-crystalline undoped $Ga_{0.1}In_{0.9}N$ are alternately grown on the n-type contact layer 4 with carrier gas ($H_2$: about 1% to about 5%) of $H_2$ and $N_2$ and material gas of $NH_3$, TEGa and TMIn at a growth rate of about 0.4 nm/s. while holding the sapphire substrate 21 at a single crystal growth temperature of about 850° C., thereby forming the MQW emission layer 15, similarly to the second embodiment. Then, the protective layer 66 of single-crystalline Mg-doped $Al_{0.2}Ga_{0.8}N$ is grown on the MQW emission layer 15 with carrier gas ($H_2$: about 1% to about 3%) of $H_2$ and $N_2$, material gas of $NH_3$, TMGa and TMAl and dopant gas of $Cp_2Mg$ at a growth rate of about 0.4 nm/s.

Thereafter the p-type cladding layer 67 of single-crystalline Mg-doped $Al_{0.05}Ga_{0.95}N$ is formed on the protective layer 66 with carrier gas ($H_2$: about 1% to about 3%) of $H_2$ and $N_2$, material gas of $NH_3$, TMGa and TMAl and dopant gas of $Cp_2Mg$ at a growth rate of about 3 μm/h. while holding the sapphire substrate 21 at a single crystal growth temperature of about 1150° C. The p-type intermediate layer 68 of single-crystalline undoped $Al_{0.01}Ga_{0.99}N$ is formed on the p-type cladding layer 67 at a growth rate of about 3 μm/h.

Then, the p-type contact layer 69 of undoped $Ga_{0.92}In_{0.08}N$ is formed on the p-type intermediate layer 68 with carrier gas ($H_2$: about 1% to about 5%) of $H_2$ and $N_2$ and material gas of $NH_3$, TEGa and TMIn at a growth rate of about 3 μm/h. while holding the sapphire substrate 21 at a single crystal growth temperature of about 850° C. According to the sixth embodiment, the p-type intermediate layer 68 of $Al_{0.01}Ga_{0.99}N$ having a smaller Al composition than the p-type cladding layer 67 is formed on the p-type cladding layer 67 of $Al_{0.05}Ga_{0.95}N$ when the growth temperature is reduced from about 1150° C. to about 850° C. in order to form the p-type contact layer 69, whereby the surface of the p-type cladding layer 67 can be prevented from degradation. Thus, the resistance against the current flowing from the p-type contact layer 69 to the p-type cladding layer 67 can be further reduced. Inequality of in-plane resistance resulting from degradation of the p-type cladding layer 67 can be reduced, whereby irregular emission can be reduced. Thus, homogeneous emission can be attained.

Thereafter the regions of the p-type contact layer 69, the p-type intermediate layer 68, the p-type cladding layer 67, the protective layer 66, the MQW emission layer 15 and the p-type contact layer 4 are partially removed by etching such as RIBE.

As shown in FIGS. 10 and 11, the p-side electrode 10 consisting of the Pd film 10a and the Au film 10b is formed substantially on the overall upper surface of the p-type contact layer 69 by vacuum deposition or the like. The p-side pad electrode 11 consisting of the Ti film 11a and the Au film 11b is formed on the p-side electrode 10. The n-side electrode 12 of Al is formed on the surface portion of the n-type contact layer 4 exposed by etching. Thereafter the chip is heat-treated at a temperature of about 600° C., thereby bringing the p-side electrode 10 and the n-side electrode 12 into ohmic contact with the p-type contact layer 69 and the n-type contact layer 4 respectively.

Finally, the device is cut into a substantially square chip having each side of about 400 μm in length, for example, by a method such as scribing, dicing or breaking. Thus, the light-emitting diode device (ultraviolet LED chip) according to the sixth embodiment is formed as shown in FIGS. 10 and 11.

The ultraviolet LED chip according to the sixth embodiment formed in the aforementioned manner may be employed as an LED lamp by fixing the ultraviolet LED chip according to the sixth embodiment to a frame and hardening molding resin at a temperature of about 200° C.

According to the sixth embodiment, the hydrogen composition of the carrier gas is lowered when crystal-growing the layers from the protective layer 66 up to the p-type contact layer 69 as hereinabove described, thereby activating the Mg dopant. Thus, the p-type semiconductor layers 66, 67, 68 and 69 can be obtained in high carrier concentrations.

(Seventh Embodiment)

Figure 12:
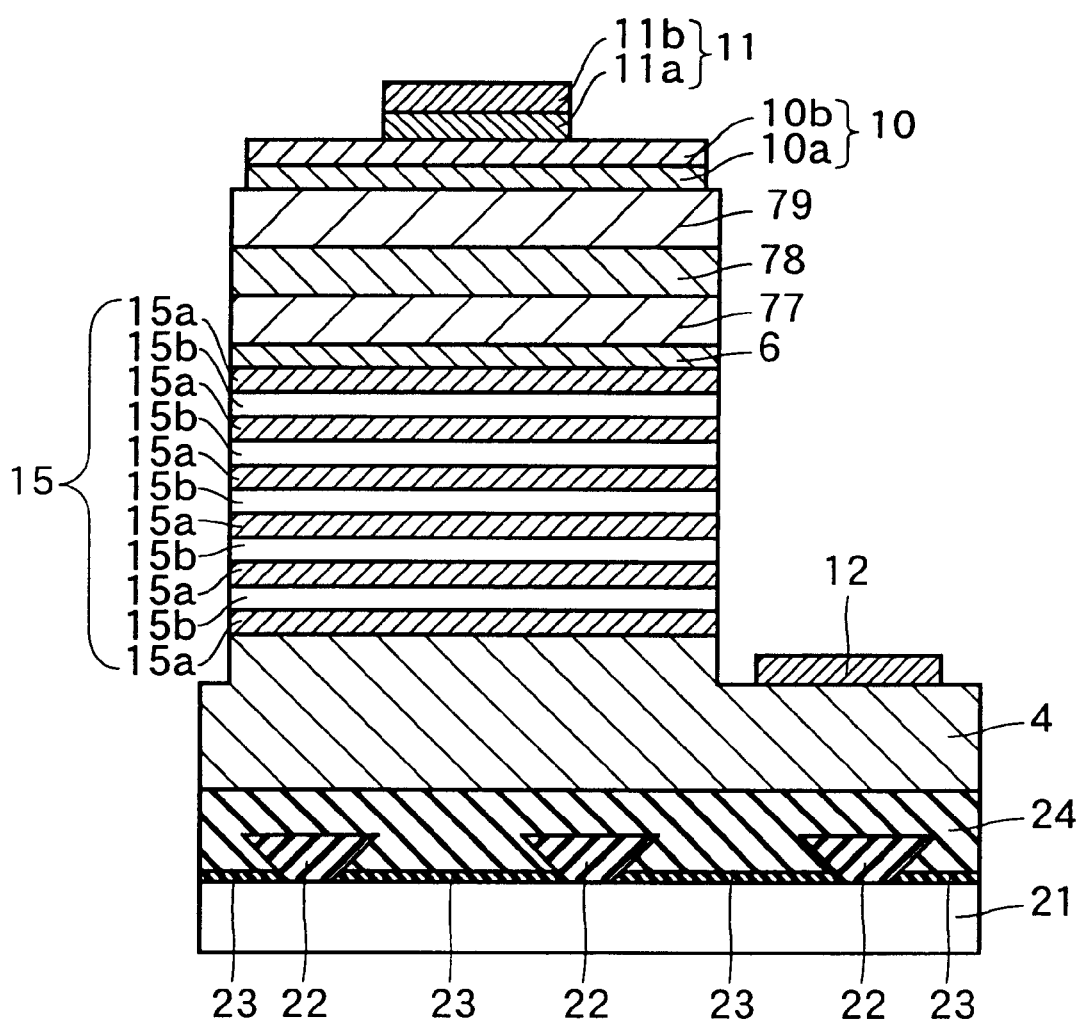
FIG. 12 is a sectional view showing a light-emitting diode device (blue LED chip) according to a seventh embodiment of the present invention.

Referring to FIG. 12, a light-emitting diode device according to a seventh embodiment of the present invention is provided with a p-type intermediate layer 78 having a continuously changing Al composition, dissimilarly to the aforementioned first to sixth embodiments.

Referring to FIG. 12, the structure of the light-emitting diode device according to the seventh embodiment is described in detail. According to the seventh embodiment, inverse-mesa (inverse-trapezoidal) mask layers 22 and low-temperature buffer layers 23 are formed on a sapphire substrate 21 as shown in FIG. 12, similarly to the sixth embodiment. An undoped GaN layer 24 having a smaller density of dislocations as compared with the high-temperature buffer layer 3 according to the first embodiment is formed on the low-temperature buffer layers 23 and the mask layers 22, to fill up openings between the mask layers 22. The layers 22 to 24 are similar in composition and thickness to those in the sixth embodiment.

An n-type contact layer 4 having a projecting portion is formed on the upper surface of the undoped GaN layer 24. An MQW emission layer 15, a protective layer 6 of undoped GaN having a thickness of about 10 nm and a p-type cladding layer 77 having a dose of about $3\times10^{19}$ cm$^{-3}$ and a carrier concentration of about $1.5\times10^{18}$ cm$^{-3}$ are formed in this order to be in contact substantially with the overall upper surface of the projecting portion of the n-type contact layer 4. The p-type cladding layer 77 is an example of the "second nitride-based semiconductor layer" and the "cladding layer" according to the present invention. The MQW emission layer 15 is formed by alternately stacking six barrier layers 15a of undoped GaN having a thickness of about 5 nm and five well layers 15b of undoped $Ga_{0.1}In_{0.9}N$ having a thickness of about 5 nm. The n-type contact layer 4 is similar in composition and thickness to that in the sixth embodiment.

According to the seventh embodiment, the p-type intermediate layer 78 of Mg-doped $Al_xGa_{1-x}N$ ($0.05 \geq X \geq 0$) having the continuously changing Al composition and a thickness of about 0.3 μm is formed on the p-type cladding layer 77. This p-type intermediate layer 78 has a dose of about $4\times10^{19}$ cm$^{-3}$ and a carrier concentration of about $2\times10^{18}$ cm$^{-3}$ to $3\times10^{18}$ cm$^{-3}$. A p-type contact layer 79 of Mg-doped $Ga_{0.92}In_{0.08}N$ having a thickness of about 3 nm with a dose of about $5\times10^{19}$ cm$^{-3}$ and a carrier concentration of about $5\times10^{18}$ cm$^{-3}$ is formed on the p-type intermediate layer 78. The composition of the p-type intermediate layer 78 continuously changes from X=0.05 to X=0 from the p-type cladding layer 77 toward the p-type contact layer 79. The p-type intermediate layer 78 substantially has an intermediate band gap between those of the p-type cladding layer 77 of $Al_{0.05}Ga_{0.95}N$ and the p-type contact layer 79 of $Ga_{0.92}In_{0.08}N$. The p-type intermediate layer 78 is an example of the "intermediate layer" according to the present invention, and the p-type contact layer 79 is an example of the "contact layer" according to the present invention.

A p-side electrode 10 formed by a Pd film 1a having a thickness of about 2 nm and an Au film 10b having a thickness of about 4 nm and a p-side pad electrode 11 formed by a Ti film 11a having a thickness of about 30 nm and an Au film 11b having a thickness of about 500 nm are formed on the upper surface of the p-type contact layer 79, similarly to the sixth embodiment. An n-side electrode 12 of Al having a thickness of about 500 nm is formed on a partially exposed region of the n-type contact layer 4.

According to the seventh embodiment, an ultraviolet LED chip having high luminous efficiency can be prepared by forming the layers 4, 15, 6, 77, 78 and 79 and the electrodes 10 to 12 on the undoped GaN layer 24 having a smaller density of dislocations as compared with the high-temperature buffer layer 3 according to the first embodiment, similarly to the second and sixth embodiments.

According to the seventh embodiment, the carrier concentration of the p-type contact layer 79 of $Ga_{0.92}In_{0.08}N$ having a smaller band gap than GaN can be rendered higher than that of a p-type contact layer consisting of GaN. Thus, the band structure on the interface between the p-type contact layer 79 and the p-side electrode 10 can be changed. Therefore, contact resistance between the p-type contact layer 79 and the p-side electrode 10 having light transmittance can be reduced. Consequently, homogeneous emission can be attained and a driving voltage can be reduced.

According to the seventh embodiment, the p-type contact layer 79 of $Ga_{0.92}In_{0.08}N$ having a smaller band gap than GaN is so provided that the electric conductivity of the p-type contact layer 79 can be higher than that of the p-type contact layer of GaN, similarly to the second and sixth embodiments. Thus, a current readily homogeneously spreads in the p-type contact layer 79, whereby homogeneous emission can be attained.

According to the seventh embodiment, the p-type intermediate layer 78 continuously changing the Al composition from 0.05 to 0 substantially has the intermediate band gap between those of the p-type contact layer 79 of $Ga_{0.92}In_{0.08}N$ and the p-type cladding layer 77 of $Al_{0.05}Ga_{0.95}N$ as hereinabove described, whereby the p-type intermediate layer 78 can reduce height of discontinuity of the band gaps of the p-type contact layer 79 and the p-type cladding layer 77. Thus, resistance against the current flowing from the p-type contact layer 79 to the p-type cladding layer 77 can be reduced. Consequently, luminous efficiency can be improved.

A method of fabricating the light-emitting diode device (ultraviolet LED chip) according to the seventh embodiment is now described with reference to FIG. 12.

First, the mask layers 22 and the low-temperature buffer layers 23 are successively formed on the sapphire substrate 21 through a fabrication process similar to that of the aforementioned sixth embodiment, as shown in FIG. 12. The undoped GaN layer 24 is selectively laterally grown on the low-temperature buffer layers 23 and the mask layers 23 by MOVPE or HVPE through the mask layers 22 serving as masks. Thereafter the n-type contact layer 4, the MQW emission layer 15 and the protective layer 6 of undoped GaN are successively formed on the undoped GaN layer 24. The layers 22 to 24, 4 and 15 are similar in composition and thickness to those of the sixth embodiment.

Thereafter the p-type cladding layer 77 of single-crystalline Mg-doped $Al_{0.05}Ga_{0.95}N$ is formed on the protective layer 6 with carrier gas (H$_2$: about 1% to about 3%) of H$_2$ and N$_2$, material gas of NH$_3$, TMGa and TMAl and dopant gas of Cp$_2$Mg at a growth rate of about 3 μm/h. while holding the sapphire substrate 21 at a single crystal growth temperature of about 1150° C.

According to the seventh embodiment, the p-type intermediate layer 78 of single-crystalline Mg-doped $Al_xGa_{1-x}N$ ($0.05 \geq X \geq 0$) having the continuously changing Al composition is formed on the p-type cladding layer 77 with carrier gas ($H_2$: about 1% to about 3%) of $H_2$ and $N_2$, material gas of $NH_3$, TMGa and TMAl and dopant gas of $Cp_2Mg$ at a growth rate of about 3 μm/h. while holding the sapphire substrate 21 at a single crystal growth temperature of about 1150° C. The Al composition of the p-type intermediate layer 78 continuously changes from the p-type cladding layer 77 toward the p-type contact layer 79 from X=0.05 to X=0.

Then, the p-type contact layer 79 of Mg-doped $Ga_{0.92}In_{0.08}N$ is formed on the p-type intermediate layer 78 through a fabrication process similar to that in the sixth embodiment while holding the sapphire substrate 21 at a single crystal growth temperature of about 850° C. According to the seventh embodiment, the p-type intermediate layer 78 of $Al_xGa_{1-x}N$ continuously changing the Al composition so that the Al composition on the upper surface is zero is formed on the p-type cladding layer 77 of $Al_{0.05}Ga_{0.95}N$ when the growth temperature is reduced from about 1150° C. to about 850° C. in order to form the p-type contact layer 79, whereby the surface of the p-type cladding layer 77 can be prevented from degradation. Thus, the resistance against the current flowing from the p-type contact layer 79 to the p-type cladding layer 77 can be further reduced. Inequality of in-plane resistance resulting from degradation of the p-type cladding layer 77 can be reduced, whereby irregular emission can be reduced. Thus, homogeneous emission can be attained.

Thereafter the regions of the p-type contact layer 79, the p-type intermediate layer 78, the p-type cladding layer 77, the protective layer 6, the MQW emission layer 15 and the p-type contact layer 4 are partially removed by etching such as RIBE.

The p-side electrode 10 and the p-side pad electrode 11 are formed on the p-type contact layer 79 while the n-side electrode 12 is formed on the surface portion of the n-type contact layer 4 exposed by etching through a process similar to that of forming the electrodes 10 to 12 in the sixth embodiment.

Finally, the device is cut into a substantially square chip having each side of about 400 μm in length, for example, by a method such as scribing, dicing or breaking, similarly to the sixth embodiment. Thus, the light-emitting diode device (ultraviolet LED chip) according to the seventh embodiment is formed as shown in FIG. 12.

(Eighth Embodiment)

Figure 13:
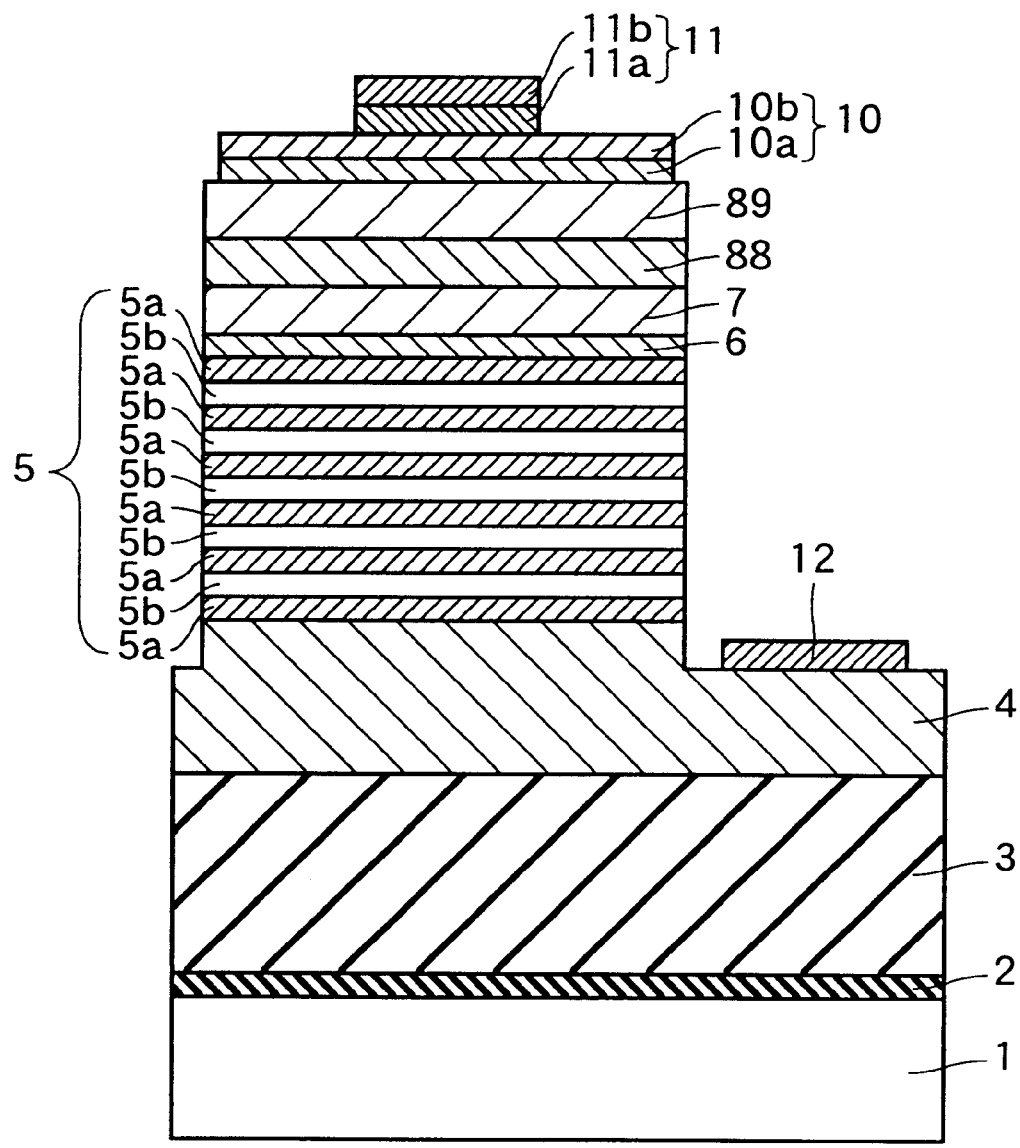
FIG. 13 is a sectional view showing a light-emitting diode device (blue LED chip) according to an eighth embodiment of the present invention.

Referring to FIG. 13, a p-type intermediate layer 88 in a light-emitting diode device according to an eighth embodiment of the present invention has a composition different from that of the p-type intermediate layer 8 according to the first embodiment shown in FIG. 1.

In the light-emitting diode device according to the eighth embodiment, layers 2 to 7 similar in composition and thickness to those in the first embodiment are formed on the (0001) plane of a sapphire substrate 1, as shown in FIG. 13. The p-type intermediate layer 88 of Mg-doped $Ga_{0.95}In_{0.05}N$ having a thickness of about 70 nm with a dose of $4 \times 10^{19}$ $cm^{-3}$ and a carrier concentration of about $6 \times 10^{18}$ $cm^{-3}$ is formed on the p-type cladding layer 7 of Mg-doped $Al_{0.05}Ga_{0.95}N$. The p-type intermediate layer 88 is an example of the "intermediate layer" according to the present invention. A p-type contact layer 89 of Mg-doped $Ga_{0.85}In_{0.15}N$ having a thickness of about 0.3 μm with a dose of about $5 \times 10^{18}$ $cm^{-3}$ and a carrier concentration of about $8 \times 10^{18}$ $cm^{-3}$ is formed on the p-type intermediate layer 88.

A p-side electrode 10 formed by a Pd film 10a having a thickness of about 2 nm and an Au film 10b having a thickness of about 4 nm and a p-side pad electrode 11 formed by a Ti film 11a having a thickness of about 30 nm and an Au film 11b having a thickness of about 500 nm are formed on the upper surface of the p-type contact layer 89, similarly to the first embodiment. An n-side electrode 12 of Al having a thickness of about 500 nm is formed on a partially exposed surface portion of the n-type contact layer 4.

According to the eighth embodiment, the p-type intermediate layer 88 of $Ga_{0.95}In_{0.05}N$ formed between the p-type cladding layer 7 and the p-type contact layer 89 has an intermediate band gap between those of the p-type contact layer 89 of $Ga_{0.85}In_{0.15}N$ and the p-type cladding layer 7 of $Al_{0.05}Ga_{0.95}N$ as described above, whereby the p-type intermediate layer 88 can reduce height of discontinuity of the band gaps of the p-type contact layer 79 and the p-type cladding layer 7. Thus, resistance against a current flowing from the p-type contact layer 89 to the p-type cladding layer 7 can be reduced. Consequently, luminous efficiency can be improved.

According to the eighth embodiment, the carrier concentration of the p-type contact layer 89 of $Ga_{0.85}In_{0.15}N$ having a smaller band gap than GaN can be rendered higher than that of a p-type contact layer consisting of GaN, similarly to the first embodiment. Thus, the band structure on the interface between the p-type contact layer 89 and the p-side electrode 10 can be changed. Therefore, contact resistance between the p-type contact layer 89 and the p-side electrode 10 having light transmittance can be reduced. Consequently, homogeneous emission can be attained and a driving voltage can be reduced.

According to the eighth embodiment, the p-type contact layer 89 of $Ga_{0.85}In_{0.15}N$ having a smaller band gap than GaN is so provided that the electric conductivity of the p-type contact layer 89 can be higher than that of the p-type contact layer of GaN, similarly to the first embodiment. Thus, the current readily homogeneously spreads in the p-type contact layer 89, whereby homogeneous emission can be attained.

A method of fabricating the light-emitting diode device (blue LED chip) according to the eighth embodiment is now described with reference to FIG. 13. First, the layers 2 to 7 are formed on the sapphire substrate 1 through a fabrication process similar to that in the first embodiment shown in FIG. 1.

According to the eighth embodiment, the p-type intermediate layer 88 of $Ga_{0.95}In_{0.05}N$ is thereafter formed on the p-type cladding layer 7 with carrier gas ($H_2$: about 1% to about 5%) of $H_2$ and $N_2$, material gas of $NH_3$, TEGa and TMIn and dopant gas of $Cp_2Mg$ at a growth rate of about 3 μm/h. while holding the sapphire substrate 1 at a single crystal growth temperature of about 850° C. Then, the p-type contact layer 89 of Mg-doped $Ga_{0.85}In_{0.15}N$ is formed on the p-type intermediate layer 88 at a growth rate of about 3 μm/h.

Thereafter the regions of the p-type contact layer 89, the p-type intermediate layer 88, the p-type cladding layer 7, the protective layer 6, the MQW emission layer 5 and the p-type contact layer 4 are partially removed by etching such as RIBE.

The p-side electrode 10 and the p-side pad electrode 11 are formed on the p-type contact layer 89 while the n-side electrode 12 is formed on the surface portion of the n-type contact layer 4 exposed by etching through a process similar to that of forming the electrodes 10 to 12 in the first embodiment.

Finally, the device is cut into a substantially square chip having each side of about 400 µm in length, for example, by a method such as scribing, dicing or breaking, similarly to the first embodiment. Thus, the light-emitting diode device (blue LED chip) according to the eighth embodiment is formed as shown in FIG. 13.

(Ninth Embodiment)

Figure 14:
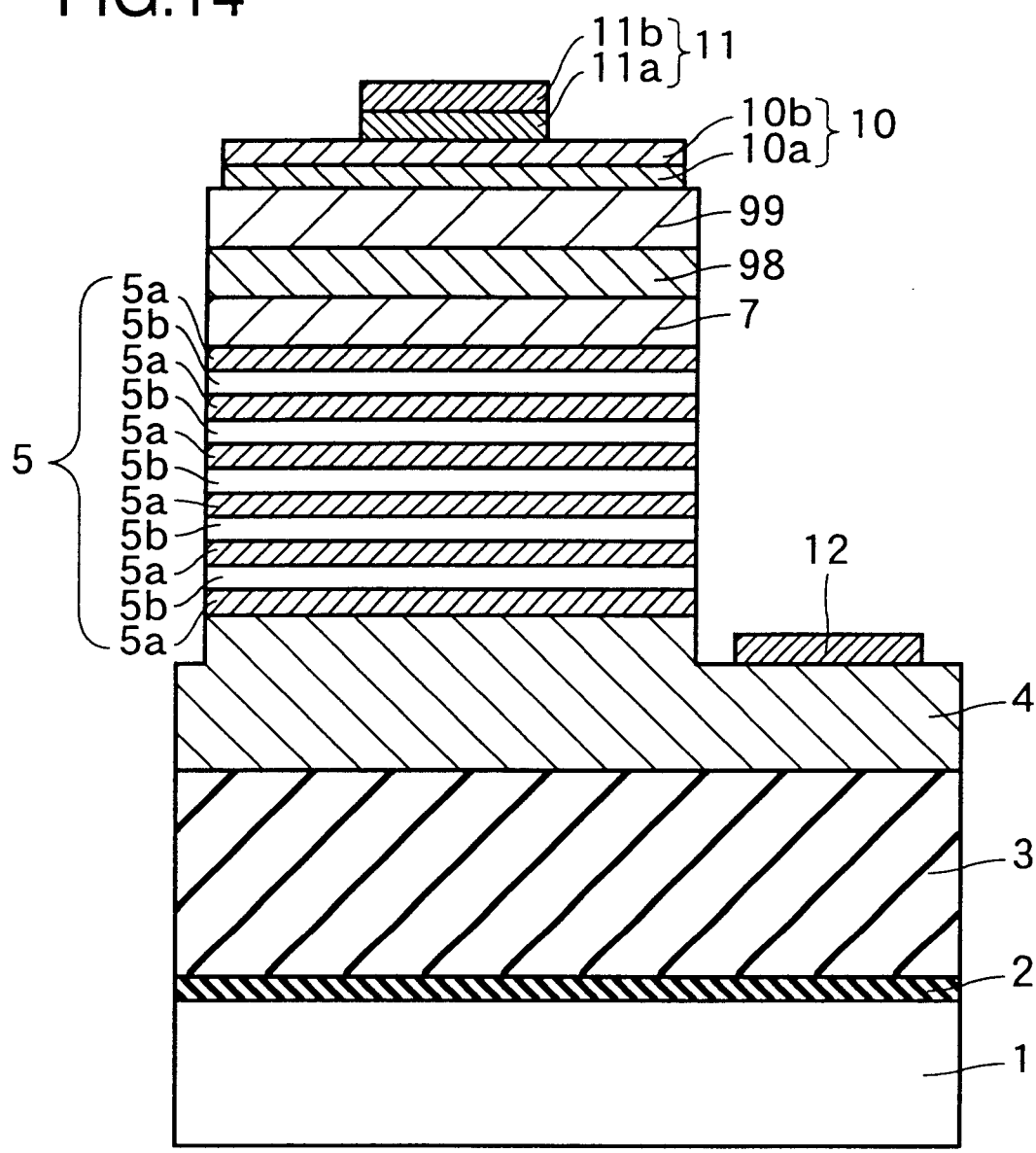
FIG. 14 is a sectional view showing a light-emitting diode device (blue LED chip) according to a ninth embodiment of the present invention.

Referring to FIG. 14, a light-emitting diode device according to a ninth embodiment of the present invention has no protective layer, and is provided with a p-type intermediate layer 98 having a composition different from that of the p-type intermediate layer 8 according to the first embodiment shown in FIG. 1.

In the light-emitting diode device according to the ninth embodiment, layers 2 to 5 similar in composition and thickness to those in the first embodiment are formed on a sapphire substrate 1, as shown in FIG. 14.

According to the ninth embodiment, a p-type cladding layer 7 of Mg-doped $Al_{0.05}Ga_{0.95}N$ having a thickness of about 0.15 µm with a dose of about $5\times10^{19}$ cm$^{-3}$ and a carrier concentration of about $2\times10^{18}$ cm$^{-3}$ is formed directly on an MQW emission layer 5, with no formation of a protective layer. The p-type intermediate layer 98 of Mg-doped $Ga_{0.95}In_{0.05}N$ having a thickness of about 0.3 µm with a dose of about $5\times10^{19}$ cm$^{-3}$ and a carrier concentration of about $5\times10^{18}$ cm$^{-3}$ is formed on the p-type cladding layer 7. A p-type contact layer 99 of undoped $Ga_{0.85}In_{0.15}N$ having a thickness of about 0.3 µm and a dose of about $5\times10^{18}$ cm$^{-3}$ is formed on the upper surface of the p-type intermediate layer 98.

According to the ninth embodiment, the p-type contact layer 99 is undoped as described above. In this case, the p-type intermediate layer 98 supplies holes to the p-type contact layer 99 due to an effect of modulation doping, whereby the p-type contact layer 99 exhibits the p-type conductivity. The p-type intermediate layer 98 is an example of the "intermediate layer" according to the present invention, and the p-type contact layer 99 is an example of the "contact layer" according to the present invention.

A p-side electrode 10 formed by a Pd film 10a having a thickness of about 2 nm and an Au film 10b having a thickness of about 4 nm and a p-side pad electrode 11 formed by a Ti film 11a having a thickness of about 30 nm and an Au film 11b having a thickness of about 500 nm are formed on the upper surface of the p-type contact layer 99, similarly to the first embodiment. An n-side electrode 12 of Al having a thickness of about 500 nm is formed on a partially exposed region of the n-type contact layer 4.

According to the ninth embodiment, the p-type intermediate layer 98 of $Ga_{0.95}In_{0.05}N$ formed between the p-type cladding layer 7 and the p-type contact layer 99 has an intermediate band gap between those of the p-type contact layer 99 of $Ga_{0.85}In_{0.15}N$ and the p-type cladding layer 7 of $Al_{0.05}Ga_{0.95}N$, whereby the p-type intermediate layer 98 can reduce height of discontinuity of the band gaps of the p-type contact layer 99 and the p-type cladding layer 7. Thus, resistance against a current flowing from the p-type contact layer 99 to the p-type cladding layer 7 can be reduced. Consequently, luminous efficiency can be improved.

According to the ninth embodiment, the carrier concentration of the p-type contact layer 99 of $Ga_{0.85}In_{0.15}N$ having a smaller band gap than GaN can be rendered higher than that of a p-type contact layer consisting of GaN, similarly to the first embodiment. Thus, the band structure on the interface between the p-type contact layer 99 and the p-side electrode 10 can be changed. Therefore, contact resistance between the p-type contact layer 99 and the p-side electrode 10 having light transmittance can be reduced. Consequently, homogeneous emission can be attained and a driving voltage can be reduced.

According to the ninth embodiment, the p-type contact layer 99 of $Ga_{0.85}In_{0.15}N$ having a smaller band gap than GaN is so provided that the electric conductivity of the p-type contact layer 99 can be higher than that of the p-type contact layer of GaN, similarly to the first embodiment. Thus, the current readily homogeneously spreads in the p-type contact layer 99, whereby homogeneous emission can be attained.

A method of fabricating the light-emitting diode device (blue LED chip) according to the ninth embodiment is now described with reference to FIG. 14. According to the ninth embodiment, layers from the MQW emission layer 5 up to the p-type contact layer 99 are continuously formed at the same temperature while forming no protective layer.

First, the layers 2 to 4 are formed on the sapphire substrate 1 as shown in FIG. 14, through a fabrication process similar to that in the first embodiment shown in FIG. 1.

Then, the MQW emission layer 5 is formed by alternately stacking six barrier layers 5a of single-crystalline undoped GaN and five well layers 5b of single-crystalline undoped $Ga_{0.65}In_{0.35}N$ on the n-type contact layer 4 through a fabrication process similar to that in the first embodiment while holding the sapphire substrate 1 at a single crystal growth temperature of about 850° C.

According to the ninth embodiment, the p-type cladding layer 7 of single-crystalline Mg-doped $Al_{0.05}Ga_{0.95}N$ is formed on the MQW emission layer 5 with carrier gas ($H_2$: about 1% to about 3%) of $H_2$ and $N_2$, material gas of $NH_3$, TEGa and TMAl and dopant gas of $Cp_2Mg$ at a growth rate of about 3 µµm/h. while continuously holding the sapphire substrate 1 at the single crystal growth temperature of about 850° C.

Then, the p-type intermediate layer 98 of $Ga_{0.95}In_{0.05}N$ is formed on the p-type cladding layer 7 with carrier gas ($H_2$: about 1% to about 3%) of $H_2$ and $N_2$, material gas of $NH_3$, TEGa and TMIn and dopant gas of $Cp_4Mg$ at a growth rate of about 3 µm/h. while continuously holding the sapphire substrate 1 at the single crystal growth temperature of about 850° C. Further, the p-type contact layer 99 of undoped $Ga_{0.85}In_{0.15}N$ is formed on the p-type intermediate layer 98 at a growth rate of about 3 µm/h.

Thereafter the regions of the p-type contact layer 99, the p-type intermediate layer 98, the p-type cladding layer 7, the MQW emission layer 5 and the p-type contact layer 4 are partially removed by etching such as RIBE.

The p-side electrode 10 and the p-side pad electrode 11 are formed on the p-type contact layer 99 while the n-side electrode 12 is formed on the surface portion of the n-type contact layer 4 exposed by etching through a process similar to that of forming the electrodes 10 to 12 in the first embodiment.

Finally, the device is cut into a substantially square chip having each side of about 400 µm in length, for example, by a method such as scribing, dicing or breaking, similarly to the first embodiment. Thus, the light-emitting diode device (blue LED chip) according to the ninth embodiment is formed as shown in FIG. 14.

According to the ninth embodiment, the MQW emission layer 5 and the semiconductor layers (the p-type cladding layer 7, the p-type intermediate layer 98 and the p-type contact layer 99) provided on the MQW emission layer 5 are continuously formed at the same temperature of about 850° C. as hereinabove described, whereby no protective layer is required for preventing the MQW emission layer 5 from deterioration resulting from temperature increase and hence the fabrication process can be simplified.

Although the present invention has been described and illustrated in detail, it is clearly understood that the same is by way of illustration and example only and is not to be taken by way of limitation, the spirit and scope of the present invention being limited only by the terms of the appended claims.

For example, while the substrate is formed by a sapphire substrate in each of the aforementioned first to ninth embodiments, the present invention is not restricted to this but the substrate may alternatively be formed by a spinel substrate, an Si substrate, an SiC substrate, a GaAs substrate, a GaP substrate, an InP substrate, a quartz substrate, a $ZrB_2$ substrate or a GaN substrate.

While the p-type contact layer is formed to have the carrier concentration of about $8 \times 10^{18}$ cm$^{-3}$ in each of the aforementioned first, third to fifth and eighth embodiments, the present invention is not restricted to this but the p-type contact layer may be formed to have a carrier concentration of at least $5 \times 10^{18}$ cm$^{-3}$. Thus, the contact resistance between the p-type contact layer and the light-transmitting p-side electrode can be readily reduced.

While the p-side electrode has a thickness of about 6 nm in each of the aforementioned first, second and sixth to ninth embodiments, the present invention is not restricted to this but the p-side electrode may have a thickness of not more than 10 nm. Thus, the p-side electrode can be readily provided with light transmittance.

While the p-side electrode consisting of the Pd film and the Au film is so formed that the Pd film is in contact with the p-type contact layer in each of the aforementioned first to ninth embodiments, the present invention is not restricted to this but the Pd film may alternatively be replaced with a film of a metal including at least one of nickel (Ni), platinum (Pt), rhodium (Rh), ruthenium (Ru), osmium (Os) and iridium (Ir) or an alloy consisting of any of these metals. Particularly when the p-side electrode is so formed that a metal film consisting of Ni, Pd or Pt is in contact with the p-type contact layer in this case, more preferable ohmic contact can be attained.

While the p-side electrode consisting of the Pd film and the Au film is so formed that the Pd film is in contact with the p-type contact layer in each of the aforementioned first to ninth embodiments, the present invention is not restricted to this but a film of a hydrogen storage alloy may be employed in place of the Pd film. The hydrogen storage alloy is preferably prepared from Mg, $Mg_XNi$ (X≈2), MgCa, $Mg_XCu$ (X≈2), $L_2Mg_X$ (X≈17), $CaNi_X$ (X≈5), $LNi_X$ (X≈5), $LCo_X$ (X≈5), $LNi_{1-X}Mn_X$ (X≈0.5), $LNi_{1-X}Al_X$ (X≈0.5), TiFe, $TiFe_{1-X}Mn_X$ (X≈0.15), TiCo, $TiCo_{1-X}Mn_X$ (X≈0.5), $TiCo_X$-$Ni_X$ (X≈0.25), $TiMn_X$ (X≈1.5), $Ti_{1-X}Zr_XMn_{2-Y}Mo_Y$ (X≈0.2, Y≈0.2), $Ti_{1-X}Zr_XMn_{2-Y-Z}V_YCr_Y$ (X≈0.1, Y≈0.2, Z≈0.4), $Ti_{1-X}Zr_XCr_{1-Y}Mn_Y$ (X≈0.2, Y≈1.2), $TiCr_X$ (X≈1.8), $Ti_XCrMn$ (X≈1.2) or $Ti_{1-X}Al_X$ (X≈0.25), where L represents a misch metal prepared from a lanthanoid element or a mixture of a rare earth element. The film of the hydrogen storage alloy is preferably annealed under a temperature condition of about 300° C. to about 500° C. before forming the Au film. Thus, the effect of desorbing hydrogen from the p-type contact layer is so increased that the concentration of holes can be increased in the contact layer. Therefore, more preferable ohmic contact can be attained.

While the Au film is formed on the Pd film coming into contact with the p-type contact layer in the p-side electrode in each of the aforementioned first to ninth embodiments, the present invention is not restricted to this but a film of an oxide containing at least one of zinc (Zn), indium (In), tin (Sn) and magnesium (Mg) may alternatively be formed on the metal film coming into contact with the p-type contact layer in place of the Au film. More specifically, a film of an oxide such as ZnO, $In_2O_3$, $SnO_2$, ITO (oxide of In and Sn) or MgO may be formed.

While the p-side electrodes 31, 41 and 51 are formed in mesh, comb-shaped and meander patterns in the aforementioned third to fifth embodiments, the present invention is not restricted to this but each of the p-side electrodes 31, 41 and 51 may alternatively be formed in combination of these patterns, a spiral pattern or an island pattern.

While the mesh p-side electrode 31 is formed to have the window formed with no electrode in the aforementioned third embodiment, the present invention is not restricted to this but part of the p-side electrode 31 may alternatively be formed in the window with a thickness of not more than 10 nm, for example, capable of transmitting light while forming the remaining part of the p-side electrode 31 with a thickness larger than that capable of transmitting light in the region other than the window.

While the mesh p-side electrode 31 is formed to have the electrode width of about 20 μm and the window width of about 50 μm in the aforementioned third embodiment, the present invention is not restricted to this but a current can be fed substantially to the overall surface of the p-type contact layer 9 also when the window width of the p-side electrode 31 is slightly increased.

While the p-side pad electrodes 32, 42 and 52 are partially formed on the upper surfaces of the p-side electrodes 31, 41 and 51 in the aforementioned third to fifth embodiments, the present invention is not restricted to this but the p-side electrodes 31, 41 and 51 formed with large thicknesses are so small in sheet resistance that no p-side pad electrodes 32, 42 and 52 may be partially formed on the upper surfaces of the p-side electrodes 31, 41 and 51.

In each of the aforementioned first to ninth embodiments, the nitride-based semiconductor may have a wurtzite crystal structure or a zinc blende crystal structure.

While each nitride-based semiconductor layer is grown by MOVPE or the like in each of the aforementioned first to ninth embodiments, the present invention is not restricted to this but crystal growth may alternatively be made by HVPE or gas source MBE employing TMAl, TMGa, TMIn, $NH_3$, $SiH_4$ or $Cp_2Mg$ as material gas.

While each nitride-based semiconductor layer is grown at the single crystal growth temperature of about 1150° C. or about 850° C. in each of the aforementioned first to ninth embodiments, the present invention is not restricted to this but crystal growth may alternatively made in the single crystal growth temperature range of about 1000° C. to about 1200° C. or about 700° C. to about 1000° C.

While the hydrogen composition of the carrier gas is reduced for activating the Mg dopant when crystal-growing the layers from the p-type cladding layer up to the p-type contact layer in each of the aforementioned first to ninth embodiments for forming each p-type semiconductor layer having a high carrier concentration (the layers 7 to 9 in the first and third to fifth embodiments, the layers 7, 8 and 19 in the second embodiment, the layers 66, 67, 68 and 69 in the sixth embodiment, the layers 77, 78 and 79 in the seventh embodiment, the layers 7, 88 and 89 in the eighth embodiment and the layers 7, 98 and 99 in the ninth embodiment), the present invention is not restricted to this but each p-type semiconductor layer may alternatively be heat-treated in an $N_2$ atmosphere in the temperature range of about 600° C. to about 800° C. Thus, each p-type semiconductor layer can be formed in a high carrier concentration.

While the p-type contact layer is prepared from GaInN having a smaller band gap than GaN in each of the aforementioned first to ninth embodiments, the present invention is not restricted to this but the p-type contact layer may alternatively be made of a material, other than GaInN, having a smaller band gap than GaN. For example, the p-type contact layer may be prepared from a nitride-based semiconductor containing Tl such as GaTlN or GaInTl or a nitride-based semiconductor containing As or P such as GaAsN, GaInAsN, GaNP or GaInN. However, the p-type contact layer is easiest to prepare when GaInN is employed.

While the p-type contact layer is formed by a single GaInN layer in each of the aforementioned first to ninth embodiments, the present invention is not restricted to this but the p-type contact layer may alternatively be formed by a superlattice layer including at least one layer consisting of GaInN or the like having a smaller band gap than GaN. The superlattice layer may be formed by a multilayer structure of a layer of $Ga_{1-X}In_XN$ having a thickness of several nm and a layer of $Ga_{1-Y}In_YN$ (X>Y>0) having a thickness of several nm or a multilayer structure of a layer of GaInN having a thickness of several nm and a layer of AlGaN (including GaN) having a thickness of several nm, for example. The p-type impurity may be doped into only a layer having a large band gap to provide a modulation doping structure, doped into only a layer having a band gap, or doped into both layers.

While the intermediate layer of GaInN, AlGaN or GaN is formed between the cladding layer and the contact layer in each of the aforementioned first to ninth embodiments, the present invention is not restricted to this but an intermediate layer consisting of a material substantially having an intermediate band gap between those of the cladding layer and the contact layer may alternatively be employed. The cladding layer is preferably made of a nitride-based semiconductor such as AlGaN having a larger band gap than GaN, in particular.

While Mg is employed as the p-type dopant in each of the aforementioned first to ninth embodiments, the present invention is not restricted to this but the p-type dopant may alternatively be prepared from Be, Ca, Sr, Ba, Zn, Cd or Hg.

What is claimed is:

1. A nitride-based semiconductor light-emitting device comprising:
    a first conductivity type first nitride-based semiconductor layer formed on a substrate;
    an emission layer, consisting of a nitride-based semiconductor, formed on said first nitride-based semiconductor layer;
    a second conductivity type second nitride-based semiconductor layer formed on said emission layer;
    a second conductivity type intermediate layer, consisting of a nitride-based semiconductor, formed on said second nitride-based semiconductor layer;
    a second conductivity type contact layer, including a nitride-based semiconductor layer having a smaller band gap than gallium nitride, formed on said intermediate layer; and
    a light-transmitting electrode formed on said contact layer.

2. The nitride-based semiconductor light-emitting device according to claim 1, wherein
    the carrier concentration of said second conductivity type contact layer is at least $5 \times 10^{18}$ $cm^{-3}$.

3. The nitride-based semiconductor light-emitting device according to claim 1, wherein
    said second conductivity type contact layer contains gallium indium nitride.

4. The nitride-based semiconductor light-emitting device according to claim 1, wherein
    said light-transmitting electrode contains at least one material selected from a group consisting of nickel, palladium, platinum and gold.

5. The nitride-based semiconductor light-emitting device according to claim 1, wherein
    said light-transmitting electrode is formed in a thickness capable of transmitting light.

6. The nitride-based semiconductor light-emitting device according to claim 5, wherein
    said light-transmitting electrode has a thickness of not more than 10 nm.

7. The nitride-based semiconductor light-emitting device according to claim 1, wherein
    said light-transmitting electrode is formed to have a window capable of transmitting light.

8. The nitride-based semiconductor light-emitting device according to claim 7, wherein
    a region of said light-transmitting electrode defining said window is formed in a thickness capable of transmitting light, and
    the remaining region of said light-transmitting electrode other than said window is formed in a thickness larger than said thickness capable of transmitting light.

9. The nitride-based semiconductor light-emitting device according to claim 7, wherein
    said light-transmitting electrode is not formed in a region defining said window capable of transmitting light, and
    the remaining region of said light-transmitting electrode other than said window is formed in a thickness larger than a thickness capable of transmitting light.

10. The nitride-based semiconductor light-emitting device according to claim 7, wherein
    said electrode having said window capable of transmitting light includes a mesh electrode.

11. The nitride-based semiconductor light-emitting device according to claim 7, wherein
    said electrode having said window capable of transmitting light includes a comb-shaped electrode.

12. The nitride-based semiconductor light-emitting device according to claim 7, wherein
    said electrode having said window capable of transmitting light includes a meander electrode.

13. The nitride-based semiconductor light-emitting diode device according to claim 1, wherein
    said first conductivity type first nitride-based semiconductor layer contains gallium nitride.

14. The nitride-based semiconductor light-emitting device according to claim 1, wherein
    said emission layer contains gallium indium nitride.

15. The nitride-based semiconductor light-emitting device according to claim 1, wherein
    said first nitride-based semiconductor layer is formed on said substrate through a buffer layer.

16. The nitride-based semiconductor light-emitting device according to claim 15, wherein said nitride-based semiconductor light-emitting device further comprises a low-dislocation-density second nitride-based semiconductor layer formed on said buffer layer by lateral growth, and said first nitride-based semiconductor layer is formed on said second nitride-based semiconductor layer.

17. The nitride-based semiconductor light-emitting device according to claim 1, wherein said substrate includes a substrate selected from a group consisting of a sapphire substrate, a spinel substrate, an Si substrate, an SiC substrate, a GaAs substrate, a GaP substrate, an InP substrate, a quartz substrate, a $ZrB_2$ substrate and a GaN substrate.

18. The nitride-based semiconductor light-emitting device according to claim 1, wherein said second conductivity type intermediate layer substantially has an intermediate band gap between the band gap of said second conductivity type contact layer and the band gap of said second conductivity type second nitride-based semiconductor layer.

19. The nitride-based semiconductor light-emitting device according to claim 18, wherein said second conductivity type second nitride-based semiconductor layer contains a nitride-based semiconductor having a larger band gap than gallium nitride.

20. The nitride-based semiconductor light-emitting device according to claim 18, wherein said second conductivity type second nitride-based semiconductor layer contains gallium aluminum nitride.

21. The nitride-based semiconductor light-emitting device according to claim 18, wherein said second conductivity type intermediate layer contains either gallium nitride or gallium indium nitride.

22. The nitride-based semiconductor light-emitting device according to claim 18, wherein said second conductivity type intermediate layer has a composition continuously changing from said second conductivity type second nitride-based semiconductor layer toward said second conductivity type contact layer.

23. The nitride-based semiconductor light-emitting device according to claim 1, including a light-emitting diode device.

24. The nitride-based semiconductor light-emitting device according to claim 1, wherein said second conductivity type contact layer is doped with a p-type impurity by at least $5 \times 10^{18}$ cm$^{-3}$.

25. The nitride-based semiconductor light-emitting device according to claim 1, wherein said second conductivity type contact layer is subjected to modulation doping to exhibit said second conductivity type.

26. The nitride-based semiconductor light-emitting device according to claim 1, wherein said second conductivity type is the p-type.

* * * * *